(12) United States Patent
Matsumura et al.

(10) Patent No.: US 9,705,034 B2
(45) Date of Patent: Jul. 11, 2017

(54) LIGHT-EMITTING DIODE, METHOD FOR MANUFACTURING LIGHT-EMITTING DIODE, LIGHT-EMITTING DIODE LAMP AND ILLUMINATION DEVICE

(71) Applicant: SHOWA DENKO K.K., Minato-ku, Tokyo (JP)

(72) Inventors: Atsushi Matsumura, Chichibu (JP); Yuu Tokunaga, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/353,239

(22) PCT Filed: Oct. 2, 2012

(86) PCT No.: PCT/JP2012/075572
§ 371 (c)(1),
(2) Date: Apr. 21, 2014

(87) PCT Pub. No.: WO2013/061735
PCT Pub. Date: May 2, 2013

(65) Prior Publication Data
US 2014/0327028 A1    Nov. 6, 2014

(30) Foreign Application Priority Data
Oct. 25, 2011 (JP) .................................. 2011-234005

(51) Int. Cl.
*H01L 33/46* (2010.01)
*H01L 33/60* (2010.01)
(Continued)

(52) U.S. Cl.
CPC ........ *H01L 33/145* (2013.01); *H01L 33/0066* (2013.01); *H01L 33/36* (2013.01);
(Continued)

(58) Field of Classification Search
CPC .. H01S 5/18311; H01S 5/34333; H01L 33/60; H01L 33/145; H01L 33/38;
(Continued)

(56) References Cited

U.S. PATENT DOCUMENTS 5,293,392 A * 3/1994 Shieh .................. H01S 5/18344
372/45.01
5,376,580 A * 12/1994 Kish et al. ...................... 438/26
(Continued)

FOREIGN PATENT DOCUMENTS

CN    101022207 A    8/2007
CN    101529605 A    9/2009
(Continued)

OTHER PUBLICATIONS

Furukawa, JP2003-101065A.*
(Continued)

*Primary Examiner* — Kimberly Rizkallah
*Assistant Examiner* — Brian Turner
(74) *Attorney, Agent, or Firm* — Sughrue Mion, PLLC

(57) ABSTRACT

A light-emitting diode, a method of manufacturing the same, a lamp and an illumination device. A light-emitting diode (100) is provided with a compound semiconductor layer (10) including a light-emitting layer (24) provided on a substrate (1); an ohmic contact electrode (7) provided between the substrate and compound semiconductor layer; an ohmic electrode (11) provided on the side of the compound semiconductor layer opposite the substrate; a surface electrode (12) including a branch section (12b) provided so as to cover the surface of the ohmic electrode and a pad section (12a) coupled to the branch section; and a current-blocking portion (13) provided between an under-pad light-emitting layer (24a) arranged in an area of the light-emitting layer that overlaps the pad section (12a) and a light-emitting layer (Continued)

arranged in an area except the area that overlaps the pad section, to prevent current from being supplied to the under-pad light-emitting layer.

19 Claims, 15 Drawing Sheets

(51) Int. Cl.
*H01L 33/42* (2010.01)
*H01L 33/36* (2010.01)
*H01L 33/14* (2010.01)
*H01L 33/38* (2010.01)
*H01L 33/00* (2010.01)
*H01L 33/40* (2010.01)
*H01L 33/44* (2010.01)
*H01L 21/02* (2006.01)

(52) U.S. Cl.
CPC .......... *H01L 33/38* (2013.01); *H01L 21/0262* (2013.01); *H01L 21/02395* (2013.01); *H01L 21/02461* (2013.01); *H01L 21/02463* (2013.01); *H01L 21/02543* (2013.01); *H01L 21/02546* (2013.01); *H01L 21/02576* (2013.01); *H01L 21/02579* (2013.01); *H01L 33/0079* (2013.01); *H01L 33/387* (2013.01); *H01L 33/405* (2013.01); *H01L 33/44* (2013.01)

(58) Field of Classification Search
CPC ....... H01L 33/22; H01L 33/405; H01L 33/30; H01L 33/10; B82Y 20/00
USPC .............. 257/E33.005, 91, 98, 99; 347/224; 372/45.07
See application file for complete search history.

(56) References Cited

U.S. PATENT DOCUMENTS

| 6,185,238 | B1* | 2/2001 | Onomura | B82Y 20/00 372/45.01 |
|---|---|---|---|---|
| 2003/0222269 | A1 | 12/2003 | Lin et al. | |
| 2004/0051110 | A1* | 3/2004 | Oohata | H01L 33/38 257/89 |
| 2005/0224839 | A1* | 10/2005 | Yagyu et al. | 257/199 |
| 2008/0217635 | A1* | 9/2008 | Emerson et al. | 257/98 |
| 2008/0265267 | A1* | 10/2008 | Unno | H01L 33/145 257/98 |
| 2009/0072257 | A1* | 3/2009 | Unno | H01L 33/405 257/98 |
| 2009/0183992 | A1* | 7/2009 | Fredenberg | B81C 99/0085 205/82 |
| 2010/0213481 | A1* | 8/2010 | Hwang | 257/98 |
| 2010/0270573 | A1* | 10/2010 | Hwang | 257/98 |
| 2010/0301362 | A1* | 12/2010 | Iizuka et al. | 257/98 |
| 2010/0301381 | A1 | 12/2010 | Urata | |
| 2010/0314642 | A1 | 12/2010 | Kudo et al. | |
| 2011/0079810 | A1 | 4/2011 | Albrecht et al. | |
| 2011/0241045 | A1 | 10/2011 | Ye et al. | |
| 2011/0241050 | A1* | 10/2011 | Ye | H01L 33/20 257/98 |
| 2011/0266579 | A1* | 11/2011 | Nagai | H01L 27/156 257/98 |
| 2012/0241724 | A1* | 9/2012 | Tsang | 257/28 |
| 2013/0001611 | A1* | 1/2013 | Wang | H01L 33/02 257/98 |

FOREIGN PATENT DOCUMENTS

| JP | 2001-177148 A | 6/2001 |
|---|---|---|
| JP | 2003-101065 A | 4/2003 |
| JP | 2005-123526 A | 5/2005 |
| JP | 2005-150646 A | 6/2005 |
| JP | 2007-149875 A | 6/2007 |
| JP | 4058937 B2 | 3/2008 |
| JP | 2009-123754 A | 6/2009 |
| JP | 2009-170655 A | 7/2009 |
| JP | 2010-278224 A | 12/2010 |
| JP | 2011-165853 A | 8/2011 |
| JP | 2012-104730 A | 5/2012 |
| KR | 10-2011-0109497 A | 10/2011 |

OTHER PUBLICATIONS

Communication dated Jul. 29, 2014, issued by the Taiwan Intellectual Property Office in counterpart Application No. 101138843.
International Search Report for PCT/JP2012/075572 dated Oct. 30, 2012.
Communication dated Jun. 16, 2015 from the Japanese Patent Office in counterpart application No. 2011-234005.
Communication dated Jun. 11, 2015 from the European Patent Office in counterpart application No. 12844259.7.
Communication dated Jun. 16, 2015 from the Korean Intellectual Property Office in counterpart application No. 10-2014-7010229.
Communication dated Feb. 1, 2016, issued by the State Intellectual Property Office of the P.R.C. in corresponding Chinese Application No. 201280051930.9.

* cited by examiner

US 9,705,034 B2

LIGHT-EMITTING DIODE, METHOD FOR MANUFACTURING LIGHT-EMITTING DIODE, LIGHT-EMITTING DIODE LAMP AND ILLUMINATION DEVICE

CROSS REFERENCE TO RELATED APPLICATION

This application is a National Stage of International Application No. PCT/JP2012/075572, filed Oct. 2, 2012, claiming priority from Japanese Patent Application No. 2011-234005, filed Oct. 25, 2011, the contents of which are incorporated herein by reference in their entirety.

TECHNICAL FIELD

The present invention relates to a light-emitting diode, a method of manufacturing a light-emitting diode, a light-emitting diode lamp and an illumination device, in particular, it relates to a light-emitting diode having an excellent light extraction efficiency and a method of manufacturing the same, and a light-emitting diode lamp and an illumination device including the light-emitting diode.

BACKGROUND ART

Conventionally, as red or infrared light-emitting diodes (LEDs) with high-luminance, compound semiconductor light-emitting diodes which include, for example, a light-emitting layer composed of aluminum gallium arsenide (composition formula: $Al_XGa_{1-X}As$; $0 \leq X \leq 1$) or a light-emitting layer composed of indium gallium arsenide (composition formula: $In_XGa_{1-X}As$; $0 \leq X \leq 1$) are known. On the other hand, as light-emitting diodes with high-luminance for emission of visible light of red, orange, yellow, or yellow-green, compound semiconductor light-emitting diodes which include, for example, a light-emitting layer composed of aluminum gallium indium phosphide (composition formula: $(Al_XGa_{1-X})_YIn_{1-Y}P$; $0 \leq X \leq 1$, $0 < Y \leq 1$) are known.

The light-emitting diode having the light-emitting layer may include a surface electrode made of a bonding pad and a linear section which is coupled to the bonding pad, on the surface opposite to the substrate.

For example, Patent Document 1 disclosed a semiconductor light-emitting device in which a hole portion penetrating an active layer and the upper layer thereof was formed, a wire bonding portion was formed via the insulating layer in the area where the active layer of the hole and the upper layer were removed, and the wire bonding portion was coupled to the linear electrode.

Patent Document 1: Publication of Japanese Patent No. 4058937

SUMMARY OF THE INVENTION

Regarding the conventional light-emitting diode, it is requested to further improve a light extraction efficiency. In particular, regarding the light-emitting diode having a high intensity light by a large current drive, the request for improving the light extraction efficiency is increasing.

The present invention was made in light of the foregoing circumstances, and its object is to provide a light-emitting diode having an excellent light extraction efficiency and a method of manufacturing the same, as well as a light-emitting diode lamp and an illumination device including the same.

In order to achieve the above object, the inventors did diligent study by focusing on absorption of light at the surface opposite to the substrate. As a result, the inventor found that the light absorbed by the bonding pad may be decreased by weakening the emission intensity of the portion directly below the bonding pad by inhibiting the current from supplying to the light emitting layer arranged in an area overlapping the bonding pad in a planar view wherein the bonding pad is a part of a surface electrode. And then the present invention was made. The present invention has the following features.

(1) A light-emitting diode comprising
a compound semiconductor layer provided on a substrate and comprising a light-emitting layer and an etching stop layer in this order;
an ohmic contact electrode provided between the substrate and the compound semiconductor layer;
an ohmic electrode provided on an opposite side of the compound semiconductor layer with respect to the substrate;
a surface electrode comprising a branch section provided so as to cover a surface of the ohmic electrode and a pad section coupled to the branch section; and
a current-blocking portion provided between an under-pad light-emitting layer arranged in an area of the light-emitting layer that overlaps the pad section in a planar view and a light-emitting layer arranged in an area except an area that overlaps the pad section in a planar view, to prevent a current being supplied to the under-pad light-emitting layer.

(2) The light-emitting diode according to (1), wherein said current-blocking portion is arranged annularly in a planar view so as to surround the under-pad light-emitting layer.

(3) The light-emitting diode according to (1) or (2), wherein said current-blocking portion is void.

Further, in order to achieve the above object, the inventors did diligent study by focusing on absorption of light at the surface opposite to the substrate. As a result, the inventor found that the light absorbed by the bonding pad may be decreased by reducing the emission intensity of the portion directly below the bonding pad by forming a light-emitting layer only in the area which does not overlap the pad section in a planar view wherein the pad section is a part of a surface electrode. And then the present invention was made. The present invention has the following features.

(4) A light-emitting diode comprising
a compound semiconductor layer provided on a substrate and comprising a light-emitting layer and an etching stop layer in this order;
an ohmic contact electrode provided between the substrate and the compound semiconductor layer;
an ohmic electrode provided on an opposite side of the compound semiconductor layer with respect to the substrate; and
a surface electrode comprising a branch section provided so as to cover a surface of the ohmic electrode and a pad section coupled to the branch section,
wherein said light-emitting layer is formed only in the area which does not overlap the pad section in a planar view.

(5) The light-emitting diode according to (4), wherein the light-emitting layer is arranged so as to surround a current-blocking portion arranged in an area that overlaps the pad section in a planar view.

(6) The light-emitting diode of any one of (1) (2) (4) (5), wherein said current-blocking portion is formed by embedding an insulating material.

(7) The light-emitting diode of any one of (1) (2) (4) (5), wherein said current-blocking portion includes a reflection layer and a translucent insulating material layer arranged between the reflection layer and the compound semiconductor layer.

(8) The light-emitting diode according to (1) to (7), wherein the substrate is any one of a Ge substrate, GaP substrate, or GaAs substrate or a metal substrate.

(9) The light-emitting diode of (1) to (8), wherein the pad section has a circular shape in a planar view.

(10) The light-emitting diode of (1) to (9), wherein the light emitting layer is consisted of any one of AlGaAs, InGaAs, or AlGaInP.

(11) The light-emitting diode of (1) to (10), wherein the ohmic contact electrode is formed in an area which does not overlap the pad section in a planar view.

(12) A light-emitting diode lamp comprising the light-emitting diode according to any one of (1) to (11).

(13) An illumination device in which multiple light-emitting diodes according to any one of (1) to (11) are mounted.

(14) A method of manufacturing a light-emitting diode comprising a surface electrode having a pad section, which comprises steps of in this order:

forming a compound semiconductor layer comprising an etching stop layer and a light-emitting layer on a growth substrate in this order;

forming a current-blocking portion consisting of a recess penetrating the light emitting layer in a periphery of the pad section of the compound semiconductor layer in a planar view by using a dry etching method and a wet etching method in this order;

forming an ohmic contact electrode on the compound semiconductor layer;

bonding a substrate to the compound semiconductor layer on a side of the ohmic contact electrode, and then removing the growth substrate;

forming an ohmic electrode on an opposite side of the compound semiconductor layer with respect to the substrate; and forming a surface electrode by forming a branch section so as to cover the surface of the ohmic electrode and a pad section coupled to the branch section.

(15) The method of manufacturing a light-emitting diode according to (14), wherein said current-blocking portion is formed by embedding an insulating material in the recess.

(16) The method of manufacturing a light-emitting diode according to (15), wherein the step of forming the ohmic contact electrode includes a step of forming a translucent layer on the compound semiconductor layer so as to form the ohmic contact electrode penetrating the translucent layer; and the step of embedding the insulating material is performed by embedding the translucent layer in the recess in the step of forming the translucent layer.

(17) The method of manufacturing a light-emitting diode according to (14), wherein the current-blocking portion is formed by depositing a translucent insulating material on an inner wall and a bottom face of the recess, and then embedding a metal material via the translucent insulating material in the recess.

(18) The method of manufacturing a light-emitting diode according to (17), wherein the step of forming the ohmic contact electrode includes a step of forming a translucent layer on the compound semiconductor layer so as to form the ohmic contact electrode penetrating the translucent layer;

the method further comprise a step of forming a reflection layer on the translucent layer before the step of removing the growth substrate; and the step of depositing of the translucent insulating material is performed in the step of forming the translucent layer, and the step of embedding the metal material is performed in the step of forming the reflection layer.

(19) A method of manufacturing a light-emitting diode comprising a surface electrode having a pad section, which comprises steps of in this order:

forming a compound semiconductor layer comprising an etching stop layer and a light-emitting layer on a growth substrate in this order;

forming a current-blocking portion consisting of a recess penetrating the light emitting layer immediately below the pad section of the compound semiconductor layer in a planar view by using a dry etching method and a wet etching method in this order;

forming an ohmic contact electrode on the compound semiconductor layer;

bonding a substrate to the compound semiconductor layer on a side of the ohmic contact electrode, and then removing the growth substrate;

forming an ohmic electrode on an opposite side of the compound semiconductor layer with respect to the substrate; and forming a surface electrode by forming a branch section so as to cover the surface of the ohmic electrode and a pad section coupled to the branch section.

(20) The method of manufacturing a light-emitting diode according to (19), wherein said current-blocking portion is formed by embedding an insulating material in the recess.

(21) The method of manufacturing a light-emitting diode according to (20), wherein the step of forming the ohmic contact electrode includes a step of forming a translucent layer on the compound semiconductor layer so as to form the ohmic contact electrode penetrating the translucent layer; and the step of embedding the insulating material is performed by embedding the translucent layer in the recess in the step of forming the translucent layer.

(22) The method of manufacturing a light-emitting diode according to (19), wherein the current-blocking portion is formed by depositing a translucent insulating material on the an inner wall and a bottom face of the recess, and then embedding a metal material via the translucent insulating material in the recess.

(23) The method of manufacturing a light-emitting diode according to (22), wherein the step of forming the ohmic contact electrode includes a step of forming a translucent layer on the compound semiconductor layer so as to form the ohmic contact electrode penetrating the translucent layer;

the method further comprises a step of forming a reflection layer on the translucent layer before the step of removing the growth substrate; and the step of depositing of the translucent insulating material is performed in the step of forming the translucent layer, and the step of embedding the metal material is performed in the step of forming the reflection layer.

(24) The method of manufacturing a light-emitting diode according to (19), wherein the current-blocking portion is formed by depositing a translucent insulating material on an inner wall and a bottom face of the recess, and then embedding a metal material and an insulating material in this order via the translucent insulating material in the recess.

In the present invention, a known functional layer, such as "a bonding layer" or "a reflection layer", may be added appropriately between "a substrate" and "an ohmic electrode". Moreover, a known functional layer may also be added between the other layers.

According to the light-emitting diode of the present invention, since the emission intensity of the portion directly below the bonding pad was weakened, or the light emission immediately below the bonding pad does not occur, it is possible to reduce the amount of light absorbed by the bonding pad among the light emitted from the light-emitting layer. Accordingly, the light-emitting diode of the present invention has an excellent light extraction efficiency. In particular, it is preferably used in light-emitting diodes having a high luminance light emission by the high current drive.

In the method of manufacturing the light-emitting diode of the present invention, since the combination of dry etching method capable to be controlled with high precision planar shape and wet etching method capable to be controlled with high accuracy the depth using the etching stop layer are used in forming a current-blocking portion consisting of the recess having a predetermined shape, the resulting light-emitting diode having excellent light extraction efficiency is obtained by inhibiting the current from flowing the portion immediately below the pad section of the surface electrode.

In more detail, a dry etching method is difficult to form high precision recess having a desired depth. Therefore, when a recess is formed only by a dry etching method, the dimensional accuracy in the depth direction of the recess is insufficient. The depth of the recess may become too deep.

A wet etching method is difficult to form a recess having vertical side with high accuracy. Therefore, when a recess is formed only by wet etching method, in order to form a recess of a desired depth, more the compound semiconductor layer has to be removed.

However, in the method of manufacturing the light-emitting diode of the present invention, after a dry etching step in the vertical direction with high accuracy within the required range in a planar view, a wet etching step using an etching stop layer is performed to reach the etching stop layer. As a result, a recess with either a predetermined planar shape or a depth with high accuracy is formed.

DETAIL DESCRIPTION OF THE INVENTION

A light-emitting diode of an embodiment according to the present invention is described below using drawings, along with its method of manufacture. There are cases where the drawings used in the following description are shown with enlargement of their characteristic parts for purposes of expediency in order to facilitate understanding of features, and the dimensional proportions and the like of the various components are not necessarily true to reality. Moreover, the materials, dimensions and the like enumerated in the following description are exemplary, and the present invention is not limited thereto, and may be implemented with appropriate modifications within a scope that does not alter its intent.

First Embodiment

[Light-Emitting Diode]

Figure 1:
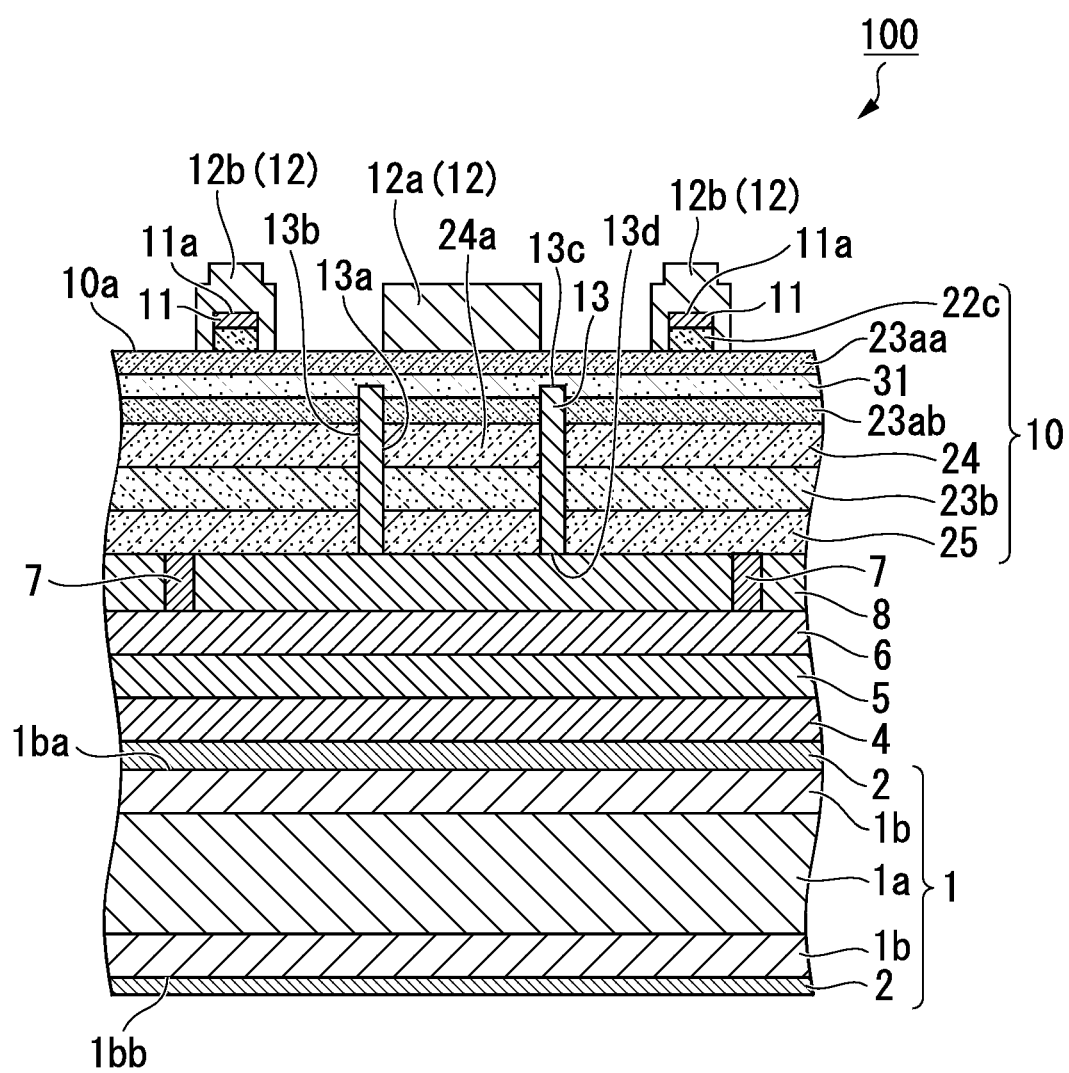
FIG. 1 is a cross-sectional schematic view of a light-emitting diode that is an example of the present invention.
Figure 2A:
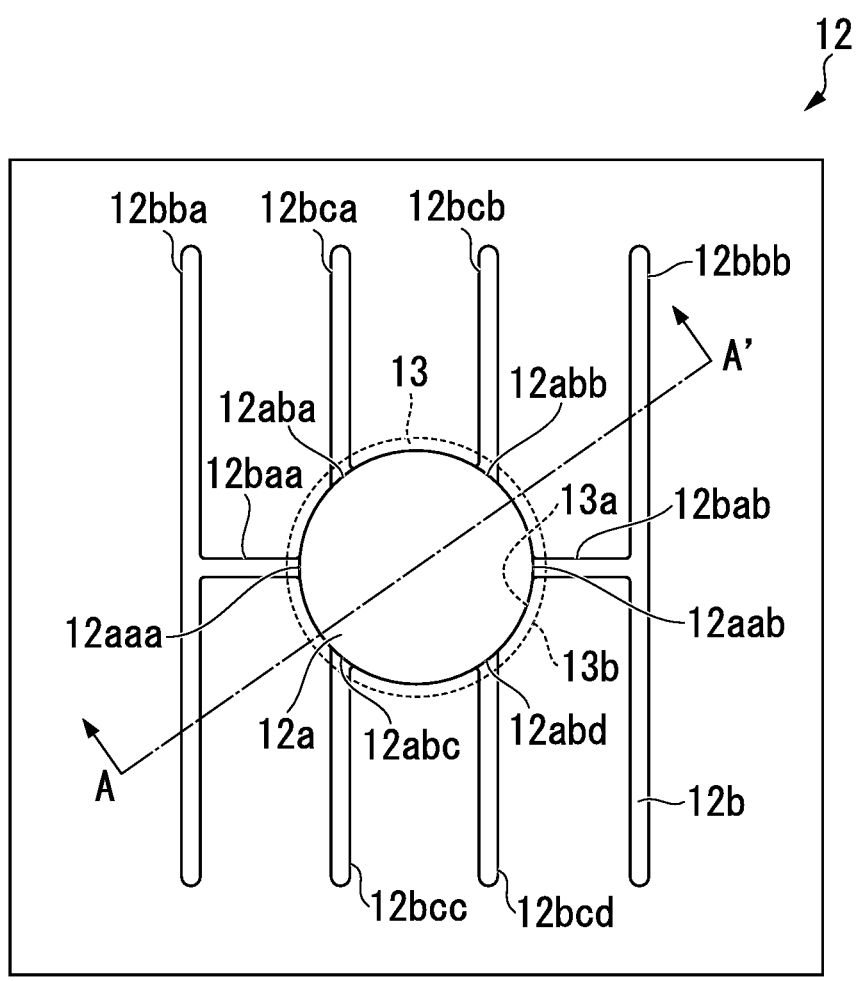
FIG. 2A is a planar schematic view showing a the surface electrode and a current-blocking portion of the light-emitting diode shown in FIG. 1.

FIG. 1 is a cross-sectional schematic view showing an example of a light-emitting diode of the present invention. FIG. 2A is a planar schematic view showing the surface electrode and a current-blocking portion of the light-emitting diode shown in FIG. 1. FIG. 1 is a sectional view corresponding to line A-A' shown in FIG. 2A.

A light-emitting diode 100 of the present embodiment includes a metal substrate 1 (substrate), a compound semiconductor layer 10 including a light emitting layer 24, an ohmic contact electrode 7, an ohmic electrode 11, a surface electrode 12, and current-blocking portion 13. The light-emitting diode 100 shown in FIG. 1 includes a bonding layer 4, a barrier layer 5, and a reflective layer 6 from the metal substrate 1 in this order between the compound semiconductor layer 10 and the metal substrate 1. Further, the ohmic contact electrodes 7 shown in FIG. 1 includes multiple conductive members having dot-shape in a planar view, and a translucent layer 8 is filled between the ohmic contact electrodes.

The light-emitting diode shown in FIG. 1 uses a metal substrate as a substrate, as an example. In the present invention, the substrate is not limited to a metal substrate. The substrate made from a material having a thermal expansion coefficient close to that of a growth substrate may be used. The light-emitting diode of the present invention is produced by steps of forming the compound semiconductor layer including a light emitting layer on a growth substrate, and removing the growth substrate after bonding another substrate (bonding substrate). When the thermal expansion coefficient of the substrate (bonding substrate) and growth substrate differs greatly, a deviation between the position of the current-blocking portion formed before a bonding step and the position of a pad section formed after the bonding step is increased. Therefore, the substrate is made from a material having a thermal expansion coefficient close to the growth substrate.

In order to suppress the deviation between the position of the current-blocking portion formed before the bonding step and the position of a pad section formed after the bonding step in a range that doesn't affect the effects of the present invention, it is preferable that the difference of thermal expansion coefficients between the bonding substrate and the growth substrate be ±1.5 ppm/K. Specifically, when a substrate (for example, GaAs (thermal expansion coefficient is 6.0 ppm/K)) was used as the growth substrate, as a bonding substrate, a Ge substrate (thermal expansion coefficient is 5.5 ppm/K), a GaP substrate (thermal expansion coefficient is 5.3 ppm/K), a GaAs substrate, a metal substrate adjusted thermal expansion coefficient (described later) or the like may be used. An example using a metal substrate as a bonding substrate is described in detail below.

<Metal Substrate>

The light-emitting diode 100 of the present embodiment includes a metal substrate 1 as a substrate, which is made of a metal layer of 1a, 1b and 1b (3 layers in the present embodiment), and a metal protective layer 2 which covers a top surface 1ba and bottom face 1bb and is resistant to etchant. It is preferable that the side face of the metal substrate 1 be covered with a metal protective layer 2. Since the metal protective layer 2 is resistant to the etchant, during etching using the etchant to remove the growth substrate for forming the compound semiconductor layer 10 including a light emitting layer 24, the corrosion of the metal substrate is inhibited.

It is also possible to use a metal substrate that is not covered with a metal protective layer 2.

The thickness of the metal substrate 1 is preferably 50 μm or more and 150 μm or less. In the case where the thickness of the metal substrate 1 is greater than 150 μm, there is an undesirable increase in the manufacturing cost of the light-emitting diode. In the case where the thickness of the metal substrate 1 is less than 50 μm, cracking, chipping, and warping tend to occur during handling, engendering a risk of reduction in manufacturing yield.

Metal Layer

With respect to the configuration of the multiple metal layers, it is preferable to alternately laminate two types of metal layer, i.e., a first metal layer and a second metal layer. As the number of first metal layers and second metal layers per metal substrate 1, a total of 3 to 9 layers is preferable, and 3 to 5 layers is more preferable. In the case where the total number of first metal layers and second metal layers is two, thermal expansion in the thickness direction is irregular, causing warpage of the metal substrate 1. Conversely, in the case where the total number of first metal layers and second metal layers exceeds nine, the layer thickness of each first metal layer and second metal layer must be made thinner. It would be difficult to fabricate a single layer substrate composed of the first metal layer or the second metal layer with a thin layer thickness; this could cause a lack of uniformity in the layer thickness of the respective layers, and lead to irregularities in the properties of the light-emitting diode 100. Furthermore, as manufacture of a single layer substrate is difficult, it would risk increasing the manufacturing cost of the light-emitting diode 100.

The total number of layers of the first metal layer and the second metal layer of the metal layer 1 is preferably an odd number. When the total number of layers of the first metal layer and the second metal layer is an odd number, it is preferable that the outermost layers be made of the same metal material. In this case, the outmost layers of the front and back can be subjected to wet etching from outside using the same etchant to remove portions corresponding to the planned cutting lines.

<<First Metal Layer>>

When the number of metal layers is odd, the first metal layer is arranged in the outermost layer (Indicated by reference numeral 1b in the present embodiment in the metal substrate 1 shown in FIG. 1). In the case where the second metal layer uses material that has a smaller thermal expansion coefficient than the compound semiconductor layer 10, the first metal layer is preferably composed of material that has a larger thermal expansion coefficient than at least the compound semiconductor layer. By adopting this configuration, the thermal expansion coefficient of the entire metal substrate will approximate the thermal expansion coefficient of the compound semiconductor layer, enabling inhibition of warping and cracking of the metal substrate when the compound semiconductor layer and the metal substrate are bonded together, and enabling improvement of the manufacturing yield of the light-emitting diode. Accordingly, in the case where the second metal layer uses material that has a larger thermal expansion coefficient than the compound semiconductor layer, the first metal layer is preferably composed of material that has a smaller thermal expansion coefficient than the compound semiconductor layer.

As the first metal layer, it is preferable to use, for example, silver (thermal expansion coefficient=18.9 ppm/K), copper (thermal expansion coefficient=16.5 ppm/K), gold (thermal expansion coefficient=14.2 ppm/K), aluminum (thermal expansion coefficient=23.1 ppm/K), nickel (thermal expansion coefficient=13.4 ppm/K), or alloys of these and the like. When the first metal layer is made of aluminum, copper, silver, gold, nickel, or alloys thereof, the excellent heat dissipation is excellent and it is possible to inhibit cracking of the substrate when bonding, it is possible to apply high voltage to emit light with high luminance.

The layer thickness of the first metal layer is preferably 5 μm or more and 50 μm or less, and more preferably 5 μm or more and 20 μm or less.

The layer thicknesses of the first metal layer and the second metal layer may differ. Furthermore, in the case where the metal substrate 1 is formed by multiple first metal layers and second metal layers, the layer thicknesses of the respective layers may differ.

Relative to the thickness of the metal substrate 1, the total thickness of the first metal layer is preferably 5% or more and 50% or less, 10% or more and 30% or less is more preferable, and 15% or more and 25% or less is still more preferable. In the case where total thickness of the first metal layer is less than 5% of the thickness of the metal substrate 1, the effects of the first metal layer that has the high thermal expansion coefficient are reduced, and the heat sink function is diminished. Conversely, in the case where the thickness of the first metal layer exceeds 50% of the thickness of the metal substrate 1, cracking of the metal substrate 1 due to heat cannot be prevented when the metal substrate 1 is coupled to the compound semiconductor layer 10. In short, due to the large difference in thermal expansion coefficients between the first metal layer and the compound semiconductor layer 10, heat-induced cracking of the metal substrate 1 and bonding defects may occur.

Particularly in the case where copper is used as the first metal layer, the total thickness of the copper relative to the thickness of the metal substrate 1 is preferably 5% or more and 40% or less, more preferably 10% or more and 30% or less, and still more preferably 15% or more and 25% or less.

The layer thickness of the first metal layer is preferably 5 µm or more and 30 µm or less, and more preferably 5 µm or more and 20 µm or less.

<<The Second Metal Layer>>

The second metal layer is placed inside when the number of the metal layers is an odd number (It is indicated by reference numeral 1a in the present embodiment in the metal substrate 1 shown in FIG. 1). When the first metal layer uses material that has a larger thermal expansion coefficient than the compound semiconductor layer, the second metal layer is preferably composed of material that has a smaller thermal expansion coefficient than the compound semiconductor layer. By adopting this configuration, the thermal expansion coefficient of the entire metal substrate 1 will approximate the thermal expansion coefficient of the compound semiconductor layer 10, enabling inhibition of warping and cracking of the metal substrate 1 when the compound semiconductor layer 10 and the metal substrate 1 are bonded together, and enabling improvement of the manufacturing yield of the light-emitting diode 100. Accordingly, in the case where the first metal layer uses material that has a smaller thermal expansion coefficient than the compound semiconductor layer 10, the second metal layer is preferably composed of material that has a larger thermal expansion coefficient than the compound semiconductor layer 10.

Further, it is preferable that the material of the second metal layer have a thermal expansion coefficient within ±1.5 ppm/K of a thermal expansion coefficient of the compound semiconductor layer 10. In this case, the heat dissipation is excellent, and it is possible to suppress the cracking of the metal substrate 1 during bonding the metal substrate 1 to the compound semiconductor layer 10.

For example, in the case where an AlGaInP layer (thermal expansion coefficient=approximately 5.3 ppm/K) is used as the compound semiconductor layer, the second metal layer preferably uses molybdenum (thermal expansion coefficient=5.1 ppm/K), tungsten (thermal expansion coefficient=4.3 ppm/K), chromium (thermal expansion coefficient=4.9 ppm/K), or alloys of these and the like.

Metal Protective Layer

The material of the metal protective layer 2, such as copper, silver, nickel, chromium, platinum, and gold may be used. It is preferable that a metal layer made of at least one of nickel or chrome having excellent adhesion and at least one of gold or platinum which is chemically stable be used. It is more preferable that a multilayer layer formed by laminating nickel layer with good adhesion to the metal layer and gold layer having excellent chemical resistance in order from the metal layer side be used.

A thickness of the metal protective layer 2 is not particularly limited. A thickness of 0.2 to 5 µm is preferable, and a thickness of 0.5 to 3 µm is more preferable, for the balance of resistance to etchant and cost. When expensive gold is used, a thickness of 2 µm or less is preferable.

The light-emitting diode 100 of the present embodiment is formed by bonding the compound semiconductor layer 10 including a light emitting layer 24 to the metal substrate 1. The metal substrate 1 includes multiple metal layers and a metal protective layer 2 which covers the top and bottom faces of the metal layers. Therefore, it has excellent heat dissipation and the diode using the metal substrates 1 has a high-brightness light-emitting using high driving current. In addition, the metal substrate 1 is hardly degraded in the step of removing a growth substrate by an etching method after bonding the compound semiconductor layer 10 to the metal substrate 1.

In the light-emitting diode 100 of the present invention, the metal substrate 1 is formed by alternately laminating a first metal layer and a second metal layer. When one of the first metal layer and the second metal layer has larger thermal expansion coefficient than that of the compound semiconductor layer 10, and another of the first metal layer and the second metal layer has smaller thermal expansion coefficient than that of the compound semiconductor layer 10, the metal substrate 1 as a whole has similar thermal expansion coefficient as the compound semiconductor layer 10. In this case, it is possible to prevent cracking of the metal substrate 1 when the compound semiconductor layer 10 and the metal substrate 1 are bonded together and to improve the manufacturing yield of the light-emitting diode.

In the light-emitting diode 100 of the present invention, when the metal substrate 1 includes the first metal layer made of copper and the second metal layer made of molybdenum, and the total number of layers of the first metal layer and the second metal layer is 3 to 9, the metal substrate 1 has an excellent heat dissipation and it is more possible to prevent cracking of the metal substrate 1 when the compound semiconductor layer 10 and the metal substrate 1 are bonded together. In addition, it is possible to emit a light with high luminance by applying a high voltage. In this case, since the metal layer 1 is formed by sandwiching a molybdenum having high mechanical strength between coppers having good machining workability, cutting the metal layer 1 become easier and as a result, the light-emitting diode 100 with a high dimensional accuracy can be obtained.

On the surface of the metal substrate 1, eutectic metal may be formed for die bonding. When die-bonging each light-emitting diodes 100 obtained by dicing the wafer, bonding to the bonding surface of the metal substrate 1 can then be conducted by eutectic bonding that has stable electrical contact.

<Bonding Layer>

The bonding layer 4 is a layer that serves to bond the compound semiconductor layer 10 and the like to the metal substrate 1. As the material of the bonding layer 4, an Au eutectic metal or the like that is chemically stable, and that has a low melting point may be used. As an Au eutectic metal, eutectic compositions of alloys such as AuGe, AuSn, AuSi, AuIn, and the like my be used. As the material of the bonding layer 4, when the metal protective layer 2 of the metal substrate 1 is made of an a Ni layer and Au layer in this order from the metal substrate 1 side, AuSi is preferable.

<Barrier Layer>

A barrier layer 5 is able to prevent metal contained in the metal substrate 1 from diffusing and reacting with the reflection layer 6. As the material of the barrier layer 5, nickel, titanium, platinum, chrome, tantalum, tungsten, molybdenum, and so on may be used. As the material of the barrier layer 5, the barrier layer is able to enhance barrier performance by combining two or more types of metal, e.g., by combining platinum and tungsten. A barrier layer 5 which is a combination of two or more metals, may be an alloy layer containing two or more metals, or may be a multilayer layer formed by laminating two or more metal layers.

The bonding layer 4 may serve as a barrier layer 5 by adding the above materials used as a barrier layer 5 into the material of the bonding layer 4. In this case, there is no need to provide a barrier layer 5 for simplifying the manufacturing process.

<Reflection Layer>

The reflection layer 6 is provided for reflecting the light from the light-emitting layer 24 and enabling improvement in light extraction efficiency. Since the reflection layer 6 is provided, the light-emitting diode can achieve higher luminance. As the material of the reflection layer 6, AgPdCu alloy (APC), and metal such as gold, copper, silver, and aluminum, as well as alloys and the like including one or more elements thereof may be used. These materials have a high light reflectance, and enable light reflectance to reach 90% or more.

<Translucent Layer>

The translucent layer 8 is formed so as to fill in an area between the multiple dot-shaped conductive members configuring the ohmic contact electrode 7. As the material of the translucent layer 8, ITO, $SiO_2$, IZO, $Si_3N_4$, $TiO_2$, TiN and the like may be used.

<Compound Semiconductor Layer>

The compound semiconductor layer 10 including the light-emitting layer 24 is a laminate structure of a compound semiconductor formed by laminated multiple layers that are epitaxially grown.

As the compound semiconductor layer 10, for example, an AlGaInP layer, AlGaInAs layer or the like that has a high light-emission efficiency and an established substrate bonding technique may be used. An AlGaInP layer is a layer consisting of material represented by the general formula $(Al_XGa_{1-X})_YIn_{1-Y}P$ ($0 \leq X \leq 1$, $0 < Y \leq 1$). This composition is determined according to the light-emitting wavelength of the light-emitting diode. Similarly, in the case of an AlGaInAs layer which is used when fabricating the light-emitting diode 100 for red and infrared light emission, the composition of the constituent material is determined according to the light-emitting wavelength of the light-emitting diode 100.

The compound semiconductor layer 10 is either an n-type or p-type conductive compound semiconductor, and a pn junction is internally formed. AlGaInAs also includes AlGaAs, GaInAs, GaAs or the like.

Here, the polarity of the surface of the compound semiconductor layer 10 may be either p-type or n-type.

The compound semiconductor layer 10 shown in FIG. 1 includes a contact layer 22*c*, a surface roughening layer 23*aa*, an etching stop layer 31, a clad layer 23*ab*, a light-emitting layer 24, a clad layer 23*b*, and a current diffusion layer 25.

The contact layer 22*c* is a layer that serves to lower the contact resistance of the ohmic electrode. For example, it is composed of Si-doped n-type GaAs, with the carrier concentration thereof of $1 \times 10^{18}$ cm$^{-3}$, and a layer thickness of 0.05 μm.

In addition, the contact layer 22*c* has the same shape as the ohmic electrode 11 in a planar view. Therefore, as shown in FIG. 1, the surface where the surface electrode 12 and the ohmic electrode 11 are provided is the surface of a surface roughening layer 23*aa*.

In the present embodiment, the contact layer 22*c* has the same shape as the ohmic electrode 11 in a planar view, however, the present invention is not limited to the shape of the contact layer 22*c* shown in FIG. 1, and the contact layer 22*c* may have the same shape as the surface roughening layer 23*aa* in a planar view, for example. In this case, the surface where the surface electrode 12 and the ohmic electrode 11 are provided is the surface of the contact layer 22*c*.

The surface roughening layer 23*aa* is obtained by roughening the surface in order to improve the light extraction efficiency. The surface roughening layer 23*aa*, for example may be composed of n-type Si-doped $(Al_{0.5}Ga_{0.5})_{0.5}In_{0.5}P$, and has the carrier concentration thereof of $3 \times 10^{18}$ cm$^{-3}$ with a thickness of 3 μm.

The etch stop layer 31 serves as a stopper in the etching step in which a recess penetrating the light-emitting layer 24 is formed in the compound semiconductor layer 10 when forming the current-blocking portion 13. As a material of the etching stop layer 31, a Si-doped n-type $(Al_{0.5}Ga_{0.5})_{0.5}In_{0.5}P$, or Si-doped n-type $(Al_{0.7}Ga_{0.3})_{0.5}As$ may be used, for example. The material may be determined according to the conditions for etching the compound semiconductor layer 10.

As a material of the etching stop layer 31, for example, when a recess penetrating the light-emitting layer 24 is formed by wet etching using a hydrochloric acid (which may be diluted), AlGaAs is preferable (Although the function of etching stop layer is irrespective of the composition, it is preferable that Al composition be 0.7 or more for inhibiting optical absorption.). When a recess penetrating the light-emitting layer 24 is formed by wet etching using SPM solution (a mixture of sulfuric acid and hydrogen peroxide), and APM solution (a mixture of hydrogen peroxide and ammonia water), AlGaInP is preferable. Regarding a combination with the material of the light-emitting layer 24, when the material of the light-emitting layer 24 is P-based material (for example, AlGaInP), it is preferable that the material of the etching stop layer 31 be As-based material (for example, AlGaAs). When the material of the light-emitting layer 24 is As-based material (for example, AlGaAs), it is preferable that the material of the etching stop layer 31 is P-based material (for example, AlGaInP). When the recess penetrating the light-emitting layer 24 is formed only using dry etching, the etch stop layer 31 may use the same material as that of the surface roughening layer. In this case, it is preferable that the thickness of the surface roughening layer increase to the extent corresponding to the thickness to be etched.

The etching stop layer 31 may be made of the same material as the surface roughening layer 23*aa*. In this case, the surface roughening layer 23*aa* also serves as the etch stop layer 31. Since the etch stop layer 31 can be formed at the same time as the surface roughening layer 23*aa*, more excellent productivity can be obtained than in the case that the etching stop layer 31 is made of a material different from the surface roughening layer 23*aa*.

The clad layer 23*ab* serves as a component of a double heterostructure. Clad layer 23*ab* may be, for example, composed of Si-doped n-type $Al_{0.5}In_{0.5}P$, with the carrier concentration thereof of $3\times10^{18}$ cm$^{-3}$ and a layer thickness of 0.5 μm.

It is preferable that the light-emitting layer 24 be composed of one of AlGaAs, GaInAs, or AlGaInP. For example, the light-emitting layer 24 may be made of a laminar structure of 20 pairs of undoped $(Al_{0.1}Ga_{0.9})_{0.5}In_{0.5}P/(Al_{0.5}Ga_{0.5})_{0.5}In_{0.5}P$, and has a layer thickness of 0.2 μm.

The light-emitting layer 24 has a structure such as double-hetero (DH), single quantum well (SQW), multi quantum well (MQW), or the like. In this instance, double hetero is a structure enclosing a carrier that supports radiative recombination. Quantum well is a structure which has a well layer and two barrier layers sandwiching the well layer, where SQW has one well layer, and MQW has two or more well layers. In order to obtain light with excellent monochromatic properties from the light-emitting layer 24, it is preferable to use an MQW structure for the light-emitting layer 24.

The clad layer 23b is, for example, composed of Mg-doped p-type $Al_{0.5}In_{0.5}P$, with the carrier concentration thereof of $8\times10^{17}$ cm$^{-3}$, and a layer thickness of 0.05 μm.

The current diffusion layer 25 is, for example, an Mg-doped p-type GaP layer, with the carrier concentration thereof of $5\times10^{18}$ cm$^{-3}$, and a layer thickness of 2 μm.

The configuration of the compound semiconductor layer 10 is not limited to the structure described above, and may also have a current blocking layer or a current constricting layer or the like in order to restrict the conduction area of the element drive current. In addition, a guide layer may be provided between the clad layers 23ab and the light-emitting layer 24. Further, for example, a contact layer 22c, an etching stop layer 31, or a surface roughening layer 23aa may be provided, optionally.

Electrode Structure

Figure 2B:
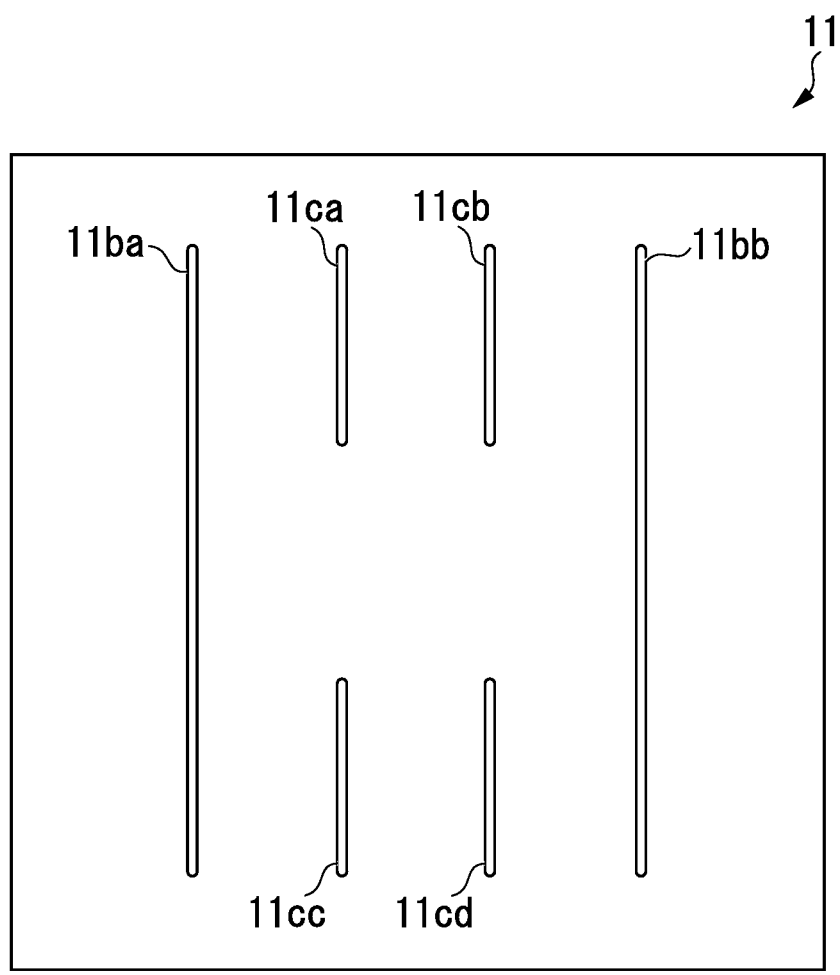
FIG. 2B is a planar schematic view showing an ohmic electrode of the light-emitting diode shown in FIG. 1.
Figure 2C:
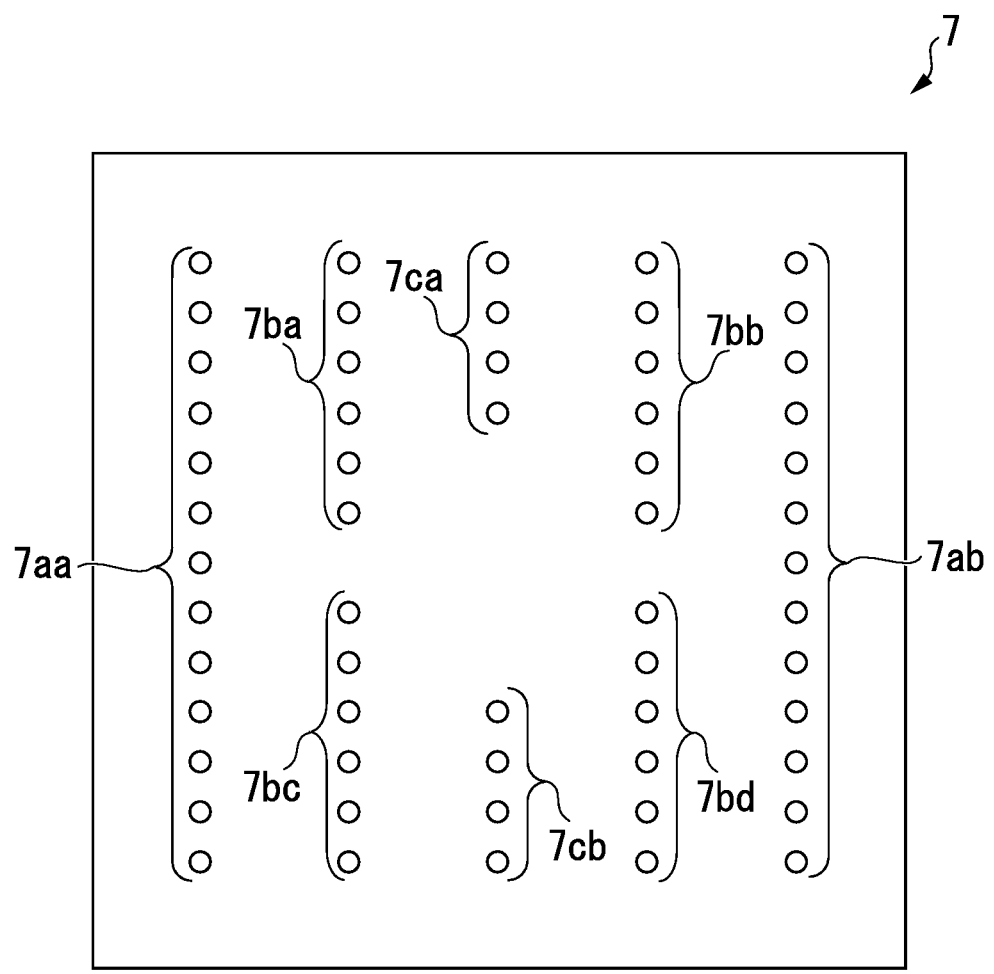
FIG. 2C is a planar schematic view showing an ohmic contact electrode of the light-emitting diode shown in FIG. 1.
Figure 2D:
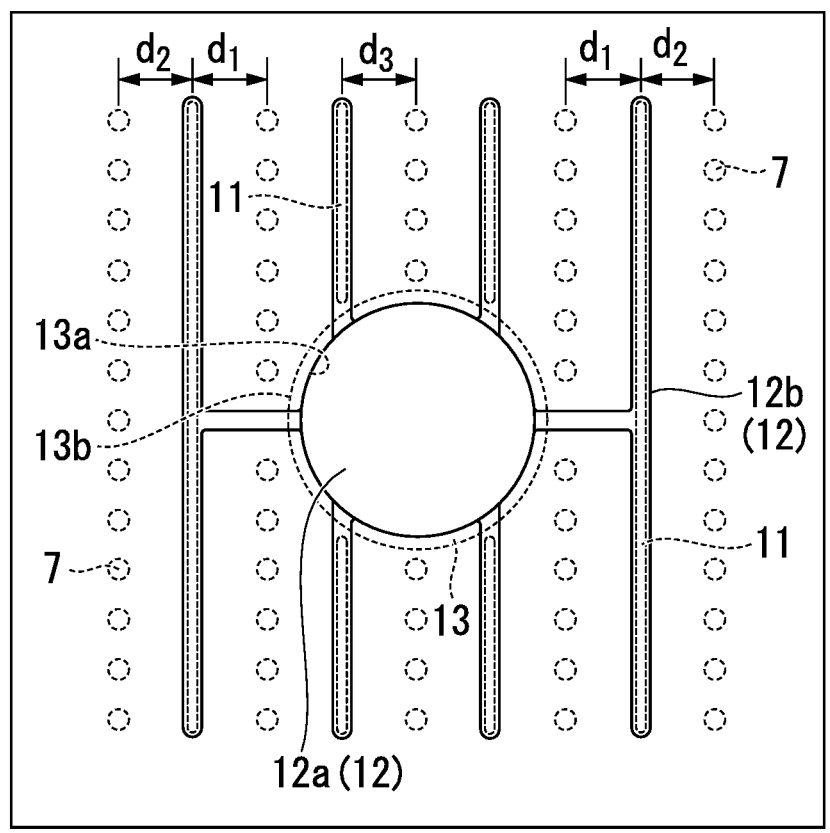
FIG. 2D is a planar schematic view showing an superimposed drawing of a surface electrode, a current-blocking portion, an ohmic electrode, and an ohmic contact electrode of the light-emitting diode shown in FIG. 1.

FIG. 2B is a planar schematic view showing an ohmic electrode of the light-emitting diode shown in FIG. 1. FIG. 2C is a planar schematic view showing an ohmic contact electrode of the light-emitting diode shown in FIG. 1. FIG. 2D is a planar schematic view showing an superimposed drawing of a surface electrode, a current-blocking portion, an ohmic electrode, and an ohmic contact electrode of the light-emitting diode shown in FIG. 1. FIGS. 2B to 2D are planar schematic views of the area corresponding to the area shown in the planar schematic view of FIG. 2A.

<Surface Electrode>

As shown in FIG. 1 and FIG. 2A, the surface electrode 12 includes a pad section 12a as a bonding pad and a linear section (branch section) 12b. The linear section 12b is provided so as to cover the surface of the ohmic electrode. The pad section 12a is coupled to the linear section 12b and both are integrated.

It is preferable that the surface electrode 12 be made of a laminate formed by laminating two or more metal layers. Specifically, a laminate of Au layer, Ti layer and Au layer (Hereinafter, referred to "Au/Ti/Au". The other laminates of a metal layer also use the express method similarly), Au/Pt/Au, Au/Cr/Au, Au/Ta/Au, Au/W/Au, Au/Mo/Au or the like may be used.

It is preferable that the pad section 12a be a circular shape in a planar view for the reason that wire bonding is easy. The pad section 12a with a non-circular shape may also be used.

A size of the pad section 12a is, for example, about 50 to 150 μm diameter when the pad section 12a has a circular shape in a planar view.

As shown in FIG. 2A, the linear section 12b includes, for example, two first linear sections 12baa and 12bab that extend in mutually opposite directions from the peripheral ends (peripheral end parts) 12aaa and 12aab that sandwich the diameter of the circular pad section 12a on a straight line that transits the center of the circular pad section 12a, and six second linear sections 12bba, 12bbb, 12bca, 12bcb, 12bcc, and 12bcd that extend orthogonally relative to the first linear sections 12baa and 12bab.

In the present embodiment, the linear section 12b includes two first linear sections and six second linear sections. These numbers of the first and the second linear sections are not particularly limited.

The second linear section 12bba and 12bbb are, respectively, coupled to ends of the first linear section 12baa and 12bab wherein the ends are opposite to the peripheral ends 12aaa and 12aab so that the second linear sections 12bba and 12bbb are separated from the pad section 12a. On the other hand, the second linear sections 12bca, 12bcb, 12bcc and 12bcd are, respectively, arranged by extending from the peripheral ends of 12aba, 12abb, 12abc, and 12abd, which are arranged at one arc or another arc between the two peripheral ends 12aaa and 12aab. The second linear sections 12bca and 12 bcb expanding from the peripheral ends 12aba, 12abb, and the second linear sections 12 bcc and 12 bcd expending from the peripheral ends 12abc, 12abd are arranged in the same linear lines, respectively, and they extends in a direction parallel to the direction of the second linear sections 12bba and 12bbb.

The width of the linear sections 12b is set wider than the width of the linear sections of the ohmic electrode 11 so as to cover them. The width is, for example, about 2 to 20 μm. Although there is no need to set the same width for all of the first linear sections and second linear sections, it is preferable from the standpoint of uniform light extraction that the linear sections 12b at a symmetrical positions to the center of the light-emitting diode 100 (the center of the pad section 12a with the circular shape in FIG. 2A) have the same widths.

<Ohmic Electrode>

The ohmic electrode 11 is arranged on an opposite side of the compound semiconductor layer 10 with respect to the metal substrate 1. As shown in FIG. 2B, the ohmic electrode 11 of the present embodiment includes 6 linear sections 11ba, 11bb, 11ca, 11cb, 11cc, and 11cd.

As the material of the ohmic electrode, AuGeNi, AuGe, AuNiSi, AuSi, and the like may be used.

In the present embodiment, it is disclosed, as an example, that the ohmic electrode 11 includes 6 linear sections. However, the number of the linear section is not particularly limited. The ohmic electrode 11 may be formed in a discontinuous arrangement underneath the linear section 12b of the surface electrode 12, e.g., in the arrangement of a dot-shaped electrode.

The ohmic electrode 11, as shown in FIG. 1, FIG. 2B, and FIG. 2D, is formed in areas which do not overlap the pad section 12a of the electrode surface 12 in a planar view. Since the ohmic electrode 11 is formed in areas which do not overlap the pad section 12a of the electrode surface 12 in a planar view, it is possible to reduce the intensity of the luminescence at an under-pad light-emitting layer 24a of the light-emitting layer 24 which is arranged in an area overlapping the pad section 12a of the electrode surface 12 in a planar view. As a result, it is possible to avoid reducing a light extraction efficiency by inhibiting the pad section 12a from absorbing a light emitted by the under-pad light-emitting layer 24a when the ohmic electrode 11 is formed in areas overlapping the pad section 12a. As a result, the light extraction efficiency is further improved.

As shown in FIG. 1, FIG. 2A, FIG. 2B, the respective 6 linear sections of the ohmic electrode 11 are arranged at positions that are respectively covered by the 6 second linear sections 12bba, 12bbb, 12bca, 12bcb, 12bcc, and 12bcd of the linear sections 12b of the surface electrode 12.

That is, the two long linear sections 11ba and 11bb arranged in a planar view outside are respectively arranged underneath the second linear sections 12bba and 12bbb, while the four short linear sections 11ca, 11cb, 11cc, and 11cd arranged in a planar view inside are respectively arranged underneath the second linear sections 12bca, 12bcb, 12bcc, and 12bcd.

The width of the linear sections of the ohmic electrode 11 is set narrower than the width of the linear section 12b of the surface electrode 12 so as to be covered by the linear section 12b of the surface electrode 12, and is, for example, about 1 to 10 µm. Although there is no need to set the same width for all of the linear sections of the ohmic electrode 11, it is preferable from the standpoint of uniform light extraction that the linear sections at a symmetrical positions to the center of the light-emitting diode 100 (the center of the pad section 12a with the circular shape in FIG. 2A) have the same widths.

Further, among the linear sections of the ohmic electrode 11, it is preferable that the shortest distance between the pad section 12a of the electrode surface 12 and the linear sections 11ca, 11cb, 11cc, 11cd which is closest to the pad section 12a be 5 to 100 µm.

<Ohmic Contact Electrode>

The ohmic contact electrode 7, as shown in FIG. 1, is provided between the metal substrate 1 and the compound semiconductor layer 10, and includes, as shown in FIG. 2C, multiple dot-shaped (point-like) conductive members having a circular shape in a planar view. A planar shape of the ohmic contact electrode 7 may be circular, elliptic, donut-shaped, linear, and so on.

AuBe, AuZn, and the like may be used as the material of the ohmic contact electrode.

As shown in FIG. 1, FIG. 2C, FIG. 2D, the dot-shaped conductive members of the ohmic contact electrode 7 are placed at positions that does not overlap the pad section 12a of the surface electrode 12 in a planar view. When the ohmic contact electrode 7 are placed at positions that does not overlap the pad section 12a of the surface electrode 12 in a planar view, it is possible to reduce the intensity of the luminescence at an under-pad light-emitting layer 24a of the light-emitting layer 24, which is arranged in an area overlapping the pad section 12a of the electrode surface 12 in a planar view.

As a result, it is possible to avoid reducing a light extraction efficiency by inhibiting the pad section 12a from absorbing a light emitted by the under-pad light-emitting layer 24a when the ohmic contact electrode 7 is formed in areas overlapping the pad section 12a. As a result, the light extraction efficiency is further improved.

As shown in FIG. 2A to FIG. 2D, the dot-shaped conductive members of the ohmic contact electrode 7 in the present embodiment are arranged in linear alignment at intermediate positions between the two linear sections of the ohmic electrode 11, and at positions on the outer sides of the linear sections 11ba and 11bb wherein a distance d2 from the linear sections 11ba and 11bb to the conductive members is on the same order as distances d1, d3 from the linear sections 11ba and 11bb to the intermediate positions between the two linear sections.

Specifically, as shown in FIG. 2D, a group 7ba of the dot-shaped conductive members is arranged in linear alignment at intermediate positions between the linear sections 11ba and linear section 11ca of the ohmic electrode 11 in a planar view. A group 7bc of the dot-shaped conductive members is arranged in linear alignment at intermediate positions between the linear sections 11ba and linear section 11ce of the ohmic electrode 11 in a planar view. A group 7bb of the dot-shaped conductive members is arranged in linear alignment at intermediate positions between the linear sections 11bb and linear section 11cb of the ohmic electrode 11 in a planar view. A group 7bd of the dot-shaped conductive members is arranged in linear alignment at intermediate positions between the linear sections 11bb and linear section 11cd of the ohmic electrode 11 in a planar view.

In addition, a group 7ca of the dot-shaped conductive members is arranged in linear alignment at intermediate positions between the linear sections 11ca and linear section 11cb of the ohmic electrode 11 in a planar view. A group 7cb of the dot-shaped conductive members is arranged in linear alignment at intermediate positions between the linear sections 11cc and linear section 11cd of the ohmic electrode 11 in a planar view.

In addition, a group 7aa of the dot-shaped conductive members is arranged in linear alignment at positions on the outer sides of the linear section 11ba wherein a distance d2 from the linear section 11ba to the conductive members is on the same order as distances d1, d3 from the linear section 11ba to the intermediate positions between the linear sections. A group lab of the dot-shaped conductive members is arranged in linear alignment at positions on the outer sides of the linear section 11bb wherein a distance d2 from the linear section 11bb to the conductive members is on the same order as distances d1, d3 from the linear section 11bb to the intermediate positions between the linear sections.

Distances d1 and d3 from the linear sections to intermediate positions between the linear sections of the ohmic electrode 11, and the distance d2 from the linear sections 11ba and 11bb to the conductive members that is on the outer sides of the linear sections 11ba and 11bb are preferably set to be equal so that a current diffusion become uniform.

The dot-shaped conductive members configuring the ohmic contact electrode 7 are, for example, cylindrical members with a diameter of about 5 to 20 µm.

With respect to the linearly aligned groups of dot-shaped conductive members, the distance between adjacent conductive members is, for example, about 5 to 50 µm.

It is preferable that the shortest distance between the conductive members of dot-shaped ohmic contact electrode 7 and the pad section 12a of the electrode surface 12 be 5 to 100 µm.

<Current-Blocking Portion>

The current-blocking portion 13 is provided for inhibiting a current supplied to the under-pad light-emitting layer 24a which is one section of the light-emitting layer 24 and is arranged at an area overlapping the pad section 12a in a planar view. The current-blocking portion 13 is, as shown in FIG. 1, arranged between a light-emitting layer arranged in an area except the area that overlaps the pad section and the under-pad light-emitting layer 24a.

As shown in FIG. 1, the current-blocking portion 13 is formed by penetrating the clad layer 23ab, light-emitting layer 24, clad layer 23b and current diffusion layer 25 of the compound semiconductor layer 10. The current-blocking portion 13 is integrated with the translucent layer 8.

It is preferable that the current-blocking portion 13, as shown in FIG. 1, FIG. 2A, FIG. 2D, have a shape of a concentric circle with the pad section 12a in a planar view, and has an annular shape in a planar view so as to surround the under-pad light-emitting layer 24a. As a result, it is possible to more effectively inhibit current supplied to the under-pad light-emitting layer 24a.

In the present embodiment, as shown in FIG. 2A, an example that the current-blocking portion 13 has an annular shape in a planar view so as to surround the under-pad light-emitting layer 24a will be described below. However, the shape of the current-blocking portion 13 is not limited to the example shown in FIG. 2A. For example, as shown in FIG. 2A, the current-blocking portion 13 may be made of one or more separated current-blocking portions having arc shapes. Even in this case, it is possible to prevent supplying current to the under-pad light-emitting layer 24a.

In the present embodiment, as shown in FIG. 1, FIG. 2A and FIG. 2D, the current-blocking portion 13 is formed by embedding an insulating material into a groove (recess) surrounded by an inner wall 13a and an outer wall 13b, wherein the inner wall 13a is arranged at the position overlapping the edge of the pad section 12a in a planar view, and the outer wall 13b is arranged at the position outside of the pad section 12a in a planar view and substantially parallel to the side face of the inner wall 13a. In addition, as shown in FIG. 1, one end face 13c of the current-blocking portion 13 in the thickness direction of the light-emitting diode 100 is provided to contact with the etch stop layer 31, and the other end face 13d is provided to contact with a surface of the translucent layer 8 at the side of the compound semiconductor layer 10.

As a distance between the inner wall 13a and the outer wall 13b, although is not particularly limited, 1 µm or more is preferable, and 5 µm or more is more preferable, so that a light-emitting layer arranged in an area except the area that overlaps the pad section in a planar view and an under-pad light-emitting layer 24a are maintained insulated from each other effectively, and an insulating material can be easily embedded into the void between the inner wall 13a and the outer wall 13b. Further, as a distance between one inner wall 13a and the other wall 13a (area surrounded by the farthest inner walls of the annular recess: corresponds to the diameter of the under-pad light-emitting layer 24a), 50 µm or less is preferable, and 10 µm or less is more preferable, so that a light-emitting layer arranged in an area except the area that overlaps the pad section in a planar view has a large enough area to obtain a sufficient brightness.

An insulating material used in the current-blocking portion 13 is not particularly limited as long as a light-emitting layer arranged in an area except the area that overlaps the pad section in a planar view and an under-pad light-emitting layer 24a can be maintained insulated from each other. For example, $SiO_2$, $Si_3N_4$, $TiO_2$, or $TiN$ may be used.

It is preferable that the insulating material used for the current-blocking portion 13 may have a light-translucent property. When a translucent insulating materials are used in the current-blocking portion 13, it is possible to forming the current-blocking portion 13 at the same time as the translucent layer 8. It is excellent in productivity.

In the present embodiment, although it has been described as an example that an insulating material is embedded into the current-blocking portion 13, the current-blocking portion 13 may be made of the void. Even if current-blocking portion is made of the void, a light-emitting layer arranged in an area except the area that overlaps the pad section in a planar view and an under-pad light-emitting layer 24a can be maintained insulated from each other, and it is possible to prevent current supplied to the under-pad light-emitting layer 24a. Therefore, even if the current-blocking portion is made of void, it is possible to weaken the emission intensity of the portion immediately below the pad section 12a, and to reduce the light absorbed by the pad section 12a.

When the current-blocking portion is made of void, as a distance between the inner wall 13a and the outer wall 13b, 1 µm or more is preferable, and 5 µm or more is more preferable, so that a light-emitting layer arranged in an area except the area that overlaps the pad section in a planar view and an under-pad light-emitting layer 24a are maintained insulated from each other effectively. Further, as a distance between one inner wall 13a and the other wall 13a (area surrounded by the farthest inner walls of the annular recess: corresponds to the diameter of the under-pad light-emitting layer 24a), 50 µm or less is preferable, and 10 µm or less is more preferable, so that a light-emitting layer arranged in an area except the area that overlaps the pad section in a planar view has enough area to obtain a sufficient brightness.

In the present embodiment, since the current-blocking portion 13 is arranged between a light-emitting layer arranged in an area except the area that overlaps the pad section in a planar view and an under-pad light-emitting layer 24a, it is possible to prevent current supplied to the under-pad light-emitting layer 24a, and to weaken the emission intensity of the portion immediately below the pad section 12a. As a result, it is possible to avoid the deterioration of light extraction efficiency due to absorbing light by the pad section 12a. Thus, according to the light-emitting diodes 100 of the present embodiment, it is possible to obtain an excellent light extraction efficiency.

Figure 3:
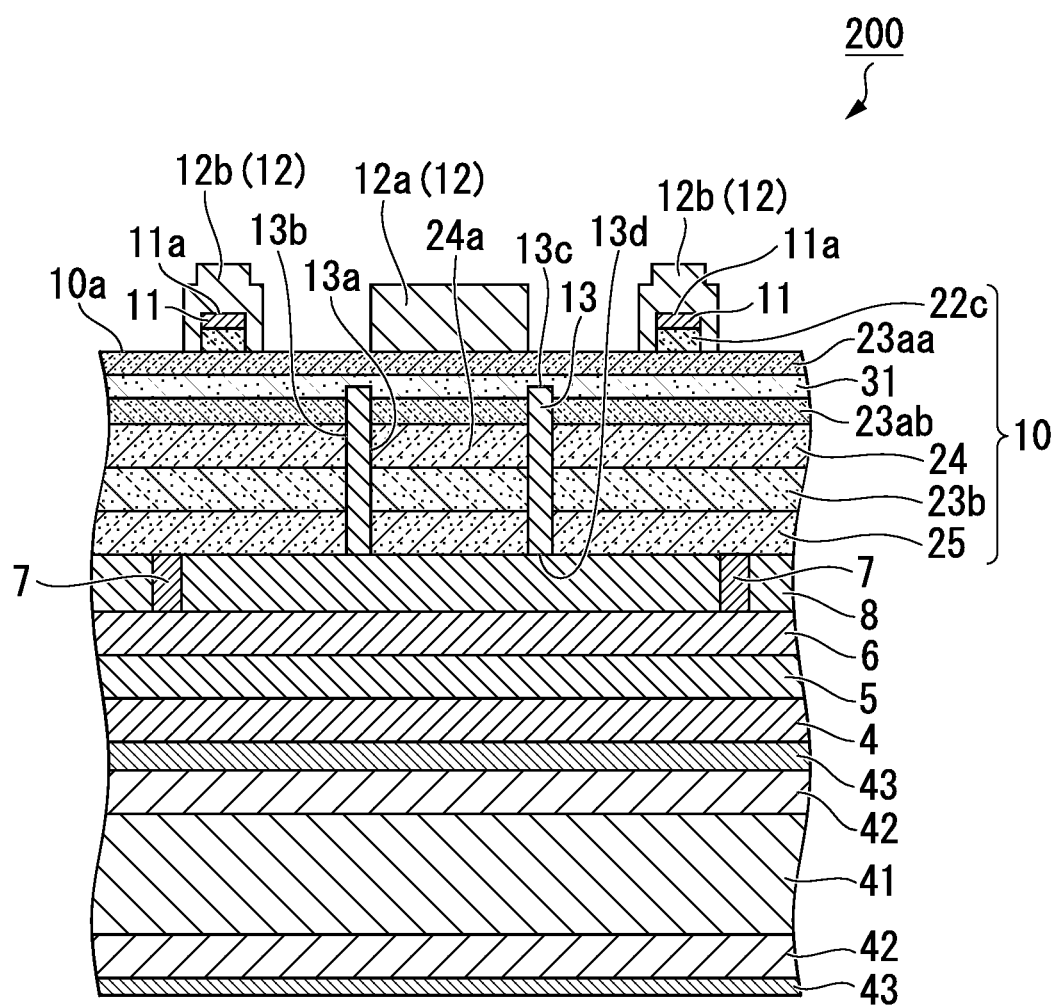
FIG. 3 is a cross-sectional schematic view showing an example using a Ge substrate as a substrate in the light-emitting diode of the present invention.

FIG. 3 is a cross-sectional schematic view showing an example using a Ge substrate as a substrate in a light-emitting diode of the present invention.

The difference between a light-emitting diode 200 shown in FIG. 3 and the light-emitting diode 100 shown in FIG. 1 is that the light-emitting diode 200 includes a Ge substrate 41. In the example shown in FIG. 3, on the upper and lower surfaces of the Ge substrate 41, a metal layer 42 (for example, Pt layer) which has good adhesion with Ge is provided. On the upper and lower surfaces of the metal layer 42, a metal layer 43 (for example, Au layer) with excellent chemical resistance is provided.

When producing the light-emitting diode 200 shown in FIG. 3, after forming a metal layer 42 and a metal layer 43 on the top surface of the Ge substrate 41 in this order, the compound semiconductor layer 10 is bonded to the Ge substrate 41 on the side of an ohmic contact electrode 7 (above a bonding layer 4). Then, on the lower surface of the Ge substrate 41, a metal layer 42 and a metal layer 43 is formed in this order.

[Method of Manufacturing Light-Emitting Diode]

An example of a method of manufacturing a light-emitting diode of the present invention, the method of manufacturing a light-emitting diode shown in FIG. 1 is explained as an example.

The method of manufacturing the light-emitting diode of the present embodiment includes steps of growing a compound semiconductor layer 10 on a growth substrate, bonding a compound semiconductor layer 10 to a metal substrate 1, and then removing the growth substrate.

<Step of Producing the Metal Substrate>

Figure 5:
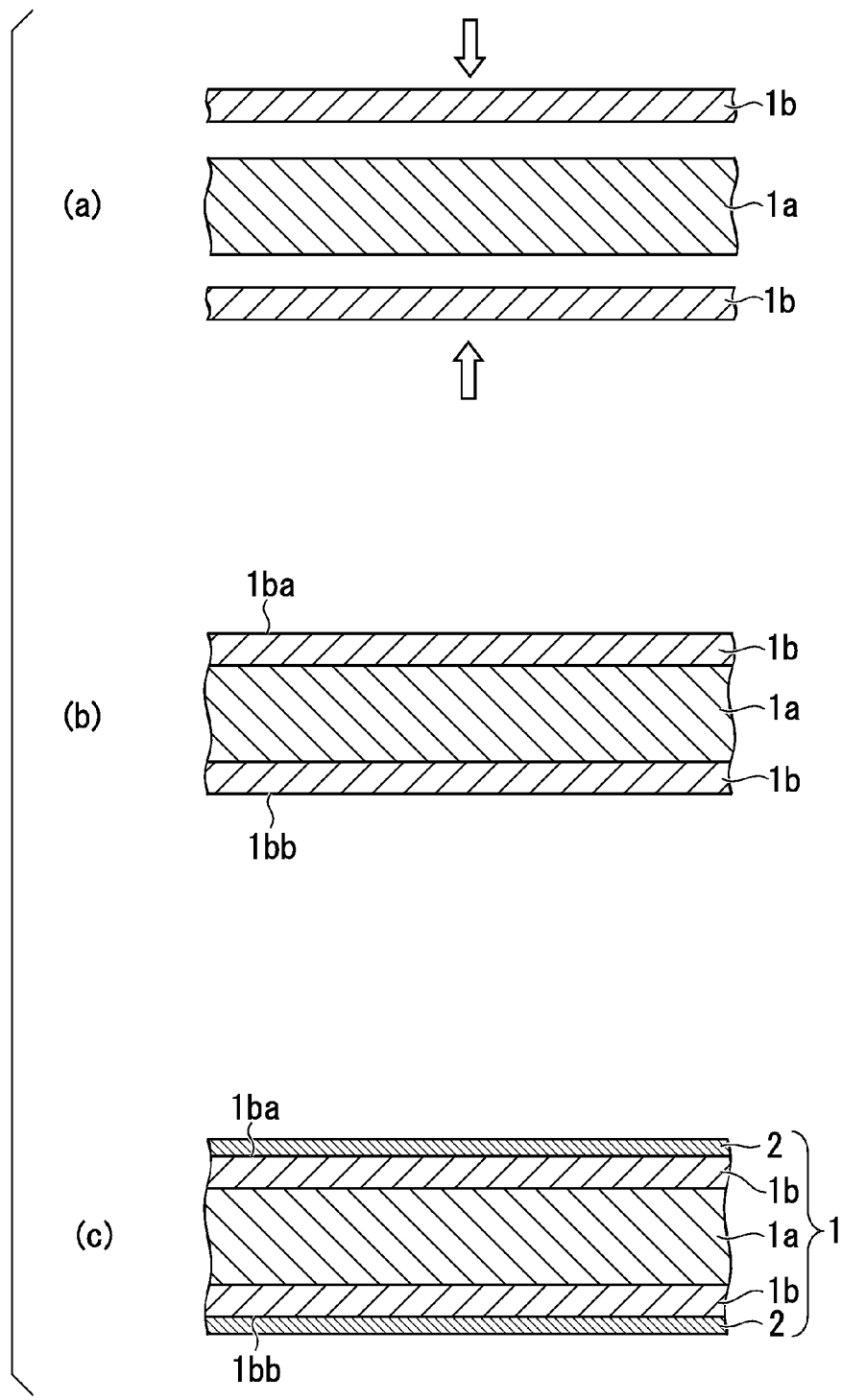
FIG. 5 (a) to (c) is a schematic cross-sectional view of a portion of a metal substrate for explaining the step of manufacturing the metal substrate.

FIG. 5 (a) to FIG. 5 (c) are cross-sectional schematic views of a portion of a metal substrate that serve to describe a metal substrate manufacturing process.

In the production of the metal substrate 1, for example, a first metal layer 1b with a thermal expansion coefficient that is higher than the material of the compound semiconductor layer 10 and a second metal layer 1b with a thermal expansion coefficient that is smaller than the material of the compound semiconductor layer 10 are prepared, and hot pressing is conducted.

Specifically, first of all, two approximately tabular first metal layers 1b and one approximately tabular second metal layer 1a are prepared. For example, Cu of 10 µm thickness is used as the first metal layer 1b, and Mo of 75 µm thickness is used as the second metal layer 1a.

Next, as shown in FIG. 5(a), the second metal layer 1a is inserted between the two first metal layers 1b, and these are arranged with superimposition.

Next, a laminated metal structure made of two layers of the first metal layer 1 and one layer of the second metal layer 2 are arranged in a prescribed pressurization device, and loads are imposed at high temperature on the first metal layers 1b and the second metal layer 1a in the directions of the arrow marks shown in FIG. 5(a). As a result, as shown in FIG. 5(b), when the first metal layers 1b are Cu, and the second metal layer 1a is Mo, a metal substrate 1 is formed that is composed of the three layers of Cu (10 µm)/Mo (75 µm)/Cu (10 µm). The resulting metal substrate has, for example, a thermal expansion coefficient of about 5.7 ppm/K, and a thermal conductivity of about 220 W/m·K.

Next, as shown in FIG. 5(c), the metal protective layer 2 is formed covering the entire surface of the metal substrate shown in FIG. 5(b), that is, the top surface, the bottom face, and the side surfaces. At this time, as the metal substrate shown in FIG. 5(b) has yet to be cut for purposes of division into individual light-emitting diodes, the side surfaces covered by the metal protective layer are the peripheral side surfaces of the metal substrate (plate). Accordingly, in the case where the side surfaces of the metal substrate 1 of each light-emitting diode after division are to be covered with the metal protective layer 2, a separate step for covering the side surfaces with metal protective layer is conducted. As FIG. 5(c) shows part of an area of the metal substrate (plate) where there is no peripheral end side, in FIG. 5(c), the metal protective layer of a peripheral side surface is not depicted in the drawing.

The metal protective layer 2 may be formed by known layer formation methods. The plating method is most preferable because it is possible to form metal layers over the entire faces including the side faces. Regarding plating methods, any known techniques and chemicals may be used. An electroless plating method is preferable because no electrode is required and a process is simple.

For example, on the metal substrate shown in FIG. 5(b), a metal substrate 1 covered with a metal protective layer 2 made of nickel layer and gold layer on a top, side, bottom faces may be formed by plating gold after plating nickel using an electroless plating method. When forming the metal protective layer 2 using an electroless plating method, as a material of the metal protective layer 2, a known metal such as copper, silver, nickel, chromium, platinum, gold or the like may be used. It is preferable to use a combination of nickel with good adhesion and gold with excellent chemical resistance.

<Step of Forming Compound Semiconductor Layer>

FIGS. 6 to 10 are cross-sectional schematic diagrams for explaining a step of the manufacturing method of a light-emitting diode shown in FIG. 1, which is cross-sectional views at a position corresponding to the cross-sectional view shown in FIG. 1.

For forming the compound semiconductor layer 10 shown in FIG. 1, firstly, a semiconductor substrate (growth substrate) 21 is prepared, and then a multiple epitaxial laminate 30 is grown on the substrate.

Figure 6:
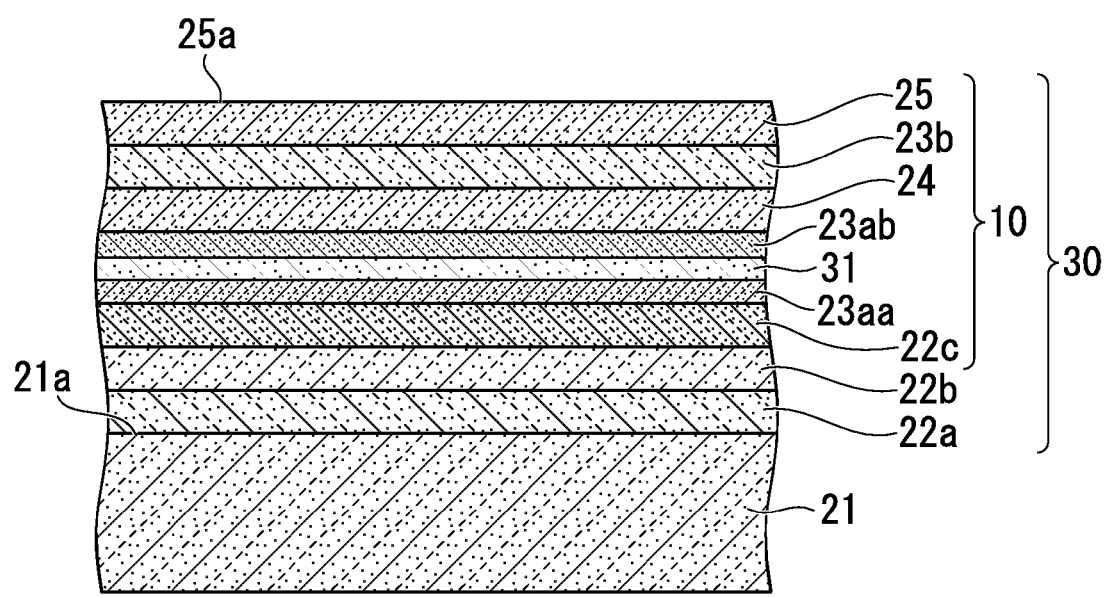
FIG. 6 is a cross-sectional schematic diagram for explaining one step of the method of manufacturing a light-emitting diode shown in FIG. 1, which is a cross-sectional view at a position corresponding to the cross-sectional view shown in FIG. 1.

The semiconductor substrate 21 is a substrate used for forming the epitaxial laminate 30 shown in FIG. 6. As the semiconductor substrate 21, for example, it is an Si-doped n-type GaAs single crystal substrate wherein a face 21a is a surface inclined at 15° from the (100) surface. In the case where AlGaInP layers or AlGaAs layers are used as the epitaxial laminate 30, a gallium arsenide (GaAs) single crystal substrate may be used as the substrate on which the epitaxial laminate 30 is formed.

As shown in FIG. 6, on one side 21a of the semiconductor substrate 21 (growth substrate) an epitaxial laminate 30 including a compound semiconductor layer 10 is formed by growing epitaxial layers.

As the method of formation of the compound semiconductor layer 10, metal organic chemical vapor deposition (MOCVD), molecular beam epitaxy (MBE), liquid phase epitaxy (LPE), or the like may be used.

In the present embodiment, the respective layers of the epitaxial laminate 30 are epitaxially grown using reduced-pressure MOCVD employing trimethyl aluminum (($CH_3)_3$Al), trimethyl gallium (($CH_3)_3$Ga), and trimethyl indium (($CH_3)_3$In) as the raw material of group-III constituent elements.

As the Mg doping raw material, bis-cyclopentadienyl magnesium (($C_5H_5)_2$Mg) is used. As the Si doping raw material, disilane ($Si_2H_6$) is used. As the raw material of group-V constituent elements, phosphine ($PH_3$) or arsine ($AsH_3$) is used.

Regarding a temperature growing an epitaxial laminate 30, the current diffusion layer 25 is, for example, grown at 750° C., and the other epitaxial growth layers are, for example, grown at 730° C.

Specifically, first of all, a buffer layer 22a composed of n-type GaAs doped with Si is formed on a surface 21a of the semiconductor substrate 21. With respect to the buffer layer 22a, for example, n-type GaAs doped with Si is used, the carrier concentration is $2 \times 10^{18}$ cm$^{-3}$, and the layer thickness is 0.2 to 0.5 µm.

Next, in the present embodiment, an substrate etching stop layer 22b composed of Si-doped n-type $(Al_{0.5}Ga_{0.5})_{0.5}In_{0.5}P$ is formed on the buffer layer 22a. The substrate etching stopper layer 22b is a layer that serves to prevent etching of the surface roughening layer 23aa when the semiconductor substrate 21 is subjected to etching removal. The substrate etching stopper layer 22b has, for example, the carrier concentration thereof $1 \times 10^{18}$ cm$^{-3}$ with a layer thickness of 0.5 µm.

Next, a contact layer 22c composed of Si-doped n-type GaAs is formed on the substrate etching stop layer 22b.

Next, a surface roughening layer 23aa composed of Si-doped n-type $(Al_{0.5}Ga_{0.5})_{0.5}In_{0.5}P$ is formed on the contact layer 22c. The contact layer 22c has, for example, the carrier concentration thereof $1 \times 10^{18}$ cm$^{-3}$ with a layer thickness of 0.05 µm.

Next, an etch stop layer 31 composed of Si-doped n-type $Al_{0.7}Ga_{0.3}As$ is formed on the surface roughening layer 23aa. The etch stop layer 31 has, for example, the carrier concentration thereof $1 \times 10^{18}$ cm$^{-3}$ with a layer thickness of 1.0 µm.

Next, an clad layer 23ab composed of Si-doped n-type $Al_{0.5}In_{0.5}P$ is formed on the etch stop layer 31. The clad layer 23ab has, for example, a layer thickness of 0.5 µm.

Next, a light-emitting layer 24 composed of a laminar structure of 20 layers of well layers and 19 layers of barrier layer is formed alternately by laminating well layers composed of undoped $(Al_{0.1}Ga_{0.9})_{0.5}In_{0.5}P$ with a thickness of about 0.005 µm and barrier layers composed of $(Al_{0.7}Ga_{0.3})_{0.5}In_{0.5}P$ with a thickness of about 0.005 µm is formed on the clad layer 23ab.

Next, a clad layer 23b composed of Mg-doped p-type $Al_{0.5}In_{0.5}P$ is formed on the light-emitting layer 24. The clad layer 23b has, for example, the carrier concentration thereof $1\times10^{18}$ cm$^{-3}$ with a layer thickness of 0.5 µm.

Next, a p-type GaP layer doped with Mg is formed on the clad layer 23b with a thickness of about 3 µm, and then is mirror-polished up to a depth of 1 to 2 µm from the surface. The current diffusion layer 25 having a surface roughness of, for example, within 0.18 nm, on a surface 25a of the current diffusion layer 25 on the side opposite to the semiconductor substrate 21 is obtained.

<Step of Forming Current-Blocking Portion>

Next, the current-blocking portion 13 made of a recess penetrating the light-emitting layer 24 is arranged in the compound semiconductor layer 10 at the portion corresponding to the periphery of the pad section 12a in a planar view by dry etching and wet etching in this order.

Figure 7A:
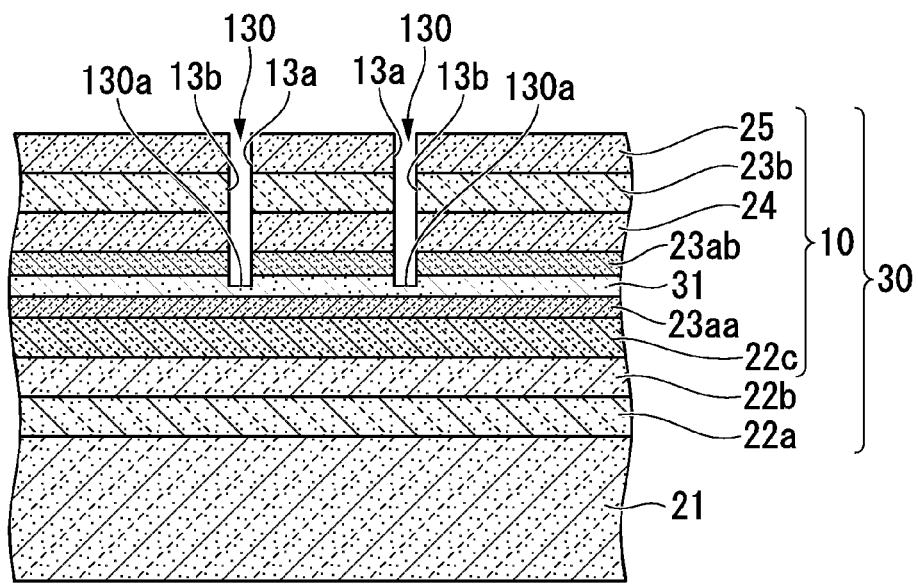
FIG. 7A is a cross-sectional schematic view for explaining one step of the method of manufacturing a light-emitting diode shown in FIG. 1, which is a cross-sectional view of a position corresponding to the sectional view shown in FIG. 1.

In the present embodiment, as shown in FIG. 2A and FIG. 7A, a groove (recess), which has an approximately circular annular shape in a planar view and a bottom 130a reaching an etch stop layer 31, is arranged so as to surrounding the under-pad light-emitting layer 24a by etching a portion of the compound semiconductor layer 10. As a result, a void 130 (recess) is formed between a light-emitting layer 24 arranged in an area except the area that overlaps the pad section 12a in a planar view and an under-pad light-emitting layer 24a.

The etching method for forming the void 130 includes both of a dry etching method in which a planar shape can be controlled with high precision and a wet etching method in which depth in thickness direction can be controlled with high accuracy.

Specifically, a resist layer is selectively formed in an area except the area to become the void in a planar view using a photolithography technique. And then, for example, etching to a depth of 2 to 4 µm is performed by dry etching method using SiCl$_4$ as an etching gas and under the conditions of bias 50 W and 10 min. After the dry etching, for example, etching to the etch stop layer is performed by a wet etching method using 1:1 diluted hydrochloric acid at 40° C.

Thus, in the present embodiment, dry etching is performed to form a predetermined shape with high accuracy in a planar view and terminated before reaching a predetermined depth in a vertical direction, and wet etching method is performed until reaching the etch stop layer, and as a result the recess with the predetermined depth is formed. Therefore, in the present embodiment, the void 130 having a predetermined planar shape and a depth dimension with high accuracy can be formed. For example, when only dry etching is used, the depth of the groove may be deeper than necessary, and when only wet etching is used, accuracy of the planar shape may be low.

In the present embodiment, as shown in FIG. 2A and FIG. 7A, the inner wall 13a of the void 130 is arranged in a position overlapping the edge of the pad section 12a in a planar view. The outer wall 13b of the void 130 is arranged in a position outside of the pad section 12a in a planar view, and the outer wall 13b is substantially parallel to the side face of the inner wall 13a. Therefore in the present embodiment, the inner wall 13a of the void 130 and the outer wall 13b are arranged as concentric circles with the pad section 12a in a planar view.

Next, an insulating material is embedded into the void 130 obtained in this manner. In the present embodiment, on the entire surface of the current diffusion layer 25, for example, a SiO$_2$ layer is formed using the CVD method, and the current-blocking portion 13 embedded with the same insulating material as the translucent layer 8 is formed at the same time of forming the translucent layer 8.

In the present embodiment, it has been described as an example that a current-blocking portion 13 is formed by forming the void 130 between a light-emitting layer arranged in an area except the area that overlaps the pad section in a planar view and an under-pad light-emitting layer 24a, and then embedding an insulating material into the void 130. However, when a current-blocking portion 13 is made of void 130, there is no need to embed an insulating material into the void 130. In this case, it is possible to simplify the manufacturing process, so it is preferable.

In addition, in a manufacturing method of the present embodiment, the current-blocking portion 13 is formed before the step of bonding a metal substrate 1 to a compound semiconductor layer 10. When a current-blocking portion 13 is formed after the step of bonding a metal substrate 1 to a compound semiconductor layer 10, void need be formed by etching the compound semiconductor layer 10 from the surface thereof at a side opposite to the metal substrate 1 toward the metal substrate 1. The etching for forming the void may make a reflective layer exposed. When the reflective layer is exposed, the material of the reflective layer may be adhered to the inner surface of the void. As a result, a problem of current leaks may arise. In the present embodiment, a metal substrate 1, a current-blocking portion 13 is formed before a step of bonding a metal substrate 1 to a compound semiconductor layer 10, the etching for forming the void 130 does not make the reflective layer exposed. It is easy to form the current-blocking portion 13.

<Step of Forming Ohmic Contact Electrode>

Figure 7B:
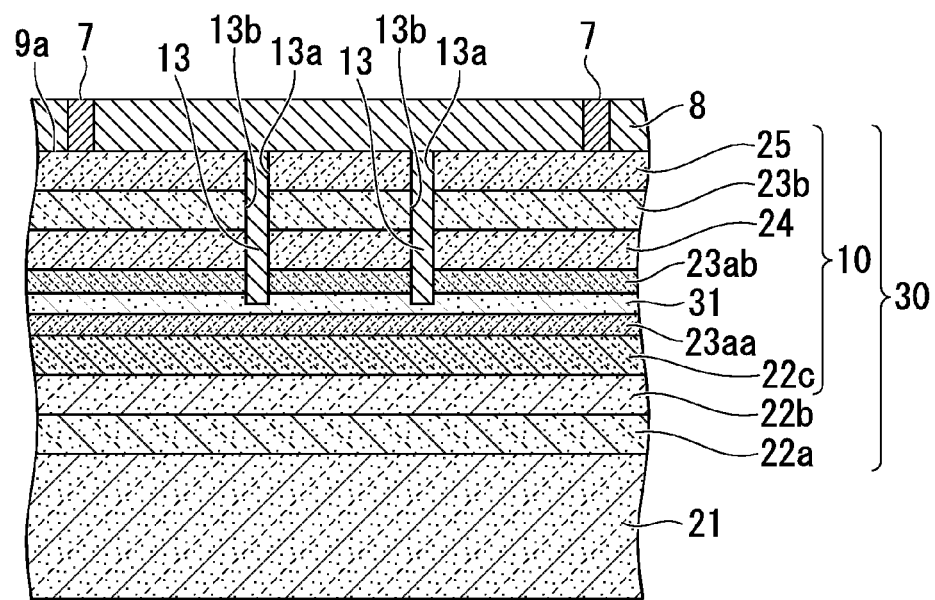
FIG. 7B is a cross-sectional schematic view for explaining one step of the method of manufacturing a light-emitting diode shown in FIG. 1, which is a cross-sectional view of a position corresponding to the sectional view shown in FIG. 1.

Next, as shown in FIG. 7B, an ohmic contact electrode 7 is formed on the current diffusion layer 25 made of GaP layer of p-type. In the present embodiment, before forming the ohmic contact electrode 7, the translucent layer 8 which the ohmic contact electrode 7 penetrates is formed on the compound semiconductor layer 10. In order to form the ohmic contact electrode 7, firstly, on the translucent layer 8, multiple through-holes in which the conductive members will be embedded to form the ohmic contact electrode 7 are formed by photolithography and etching techniques. Specifically, for example, on the translucent layer 8, a photo-resist layer having a pattern with holes corresponding to the above-mentioned through-holes is formed, and then the portion of translucent layer 8 corresponding to the through-holes is removed using hydrofluoric acid as an etchant, and as a result, multiple through-holes on the translucent layer 8 are formed.

The multiple through-holes formed on the translucent layer 8 are formed at the position corresponding to the position of the ohmic contact electrode 7 in a plan view, as shown in FIG. 2D. In other words, the multiple through-holes are arranged at the position not overlapping in a planar view the area of the pad section 12a of the surface electrode 12. The multiple through-holes are arranged in linear alignment at intermediate positions between the linear sections of the ohmic electrode 11 which will be formed later, and at positions on the outer sides of the linear sections 11ba and 11bb wherein a distance d2 from the linear sections 11ba and 11bb to the conductive members is on the same order as distances d1 from the linear sections 11ba and 11bb to the intermediate positions between the linear sections.

Next, for example, the ohmic contact electrode 7 is formed on the compound semiconductor layer 10, as shown in FIG. 7B, by embedding the AuBe alloy into the multiple through-holes of the translucent layer 8 using a vapor deposition method.

<Step of Forming Reflection Layer>

Figure 8:
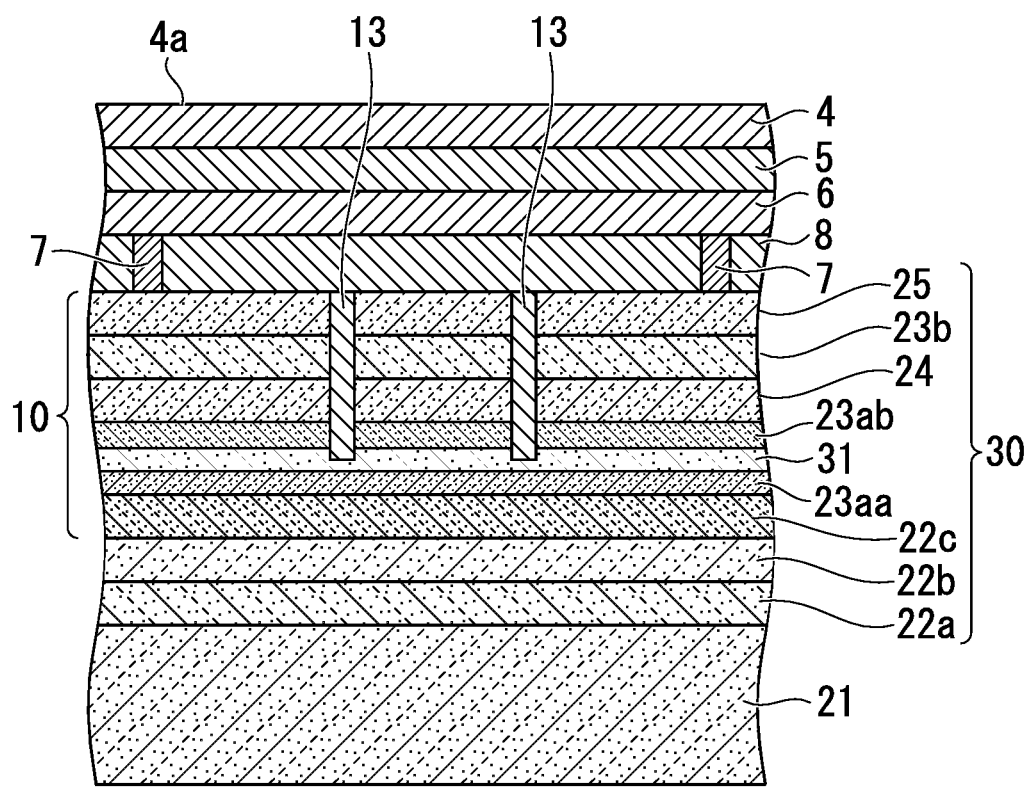
FIG. 8 is a cross-sectional schematic view for explaining one step of the method of manufacturing a light-emitting diode shown in FIG. 1, which is a cross-sectional view of a position corresponding to the sectional view shown in FIG. 1.

Next, as shown in FIG. 8, the reflection layer 6 is formed on the ohmic contact electrode 7 and the translucent layer 8. Specifically, the reflection layer 6 composed of APC or Au is formed on the ohmic contact electrode 7 and the translucent layer 8 using, for example, the vapor deposition method.

<Step of Forming Barrier Layer>

Next, as shown in FIG. 8, the barrier layer 5 is formed on the reflection layer 6. Specifically, the barrier layer 5 composed of Ni or Ti is formed on the reflection layer 6 using, for example, the vapor deposition method.

<Step of Forming Bonding Layer>

Next, as shown in FIG. 8, the bonding layer 4 is formed on the barrier layer 5. Specifically, the bonding layer 4 composed of AuGe that is an Au eutectic metal is formed on the barrier layer 5 using, for example, the vapor deposition method.

<Step of Bonding Metal Substrate>

Next, the compound semiconductor layer 10 is bonded to the metal substrate 1 on the side of the ohmic contact electrode 7.

As a method of bonding the compound semiconductor layer 10, any known technique, such as eutectic bonding, diffusion bonding, adhesive or room-temperature bonding, may be used.

Figure 9:
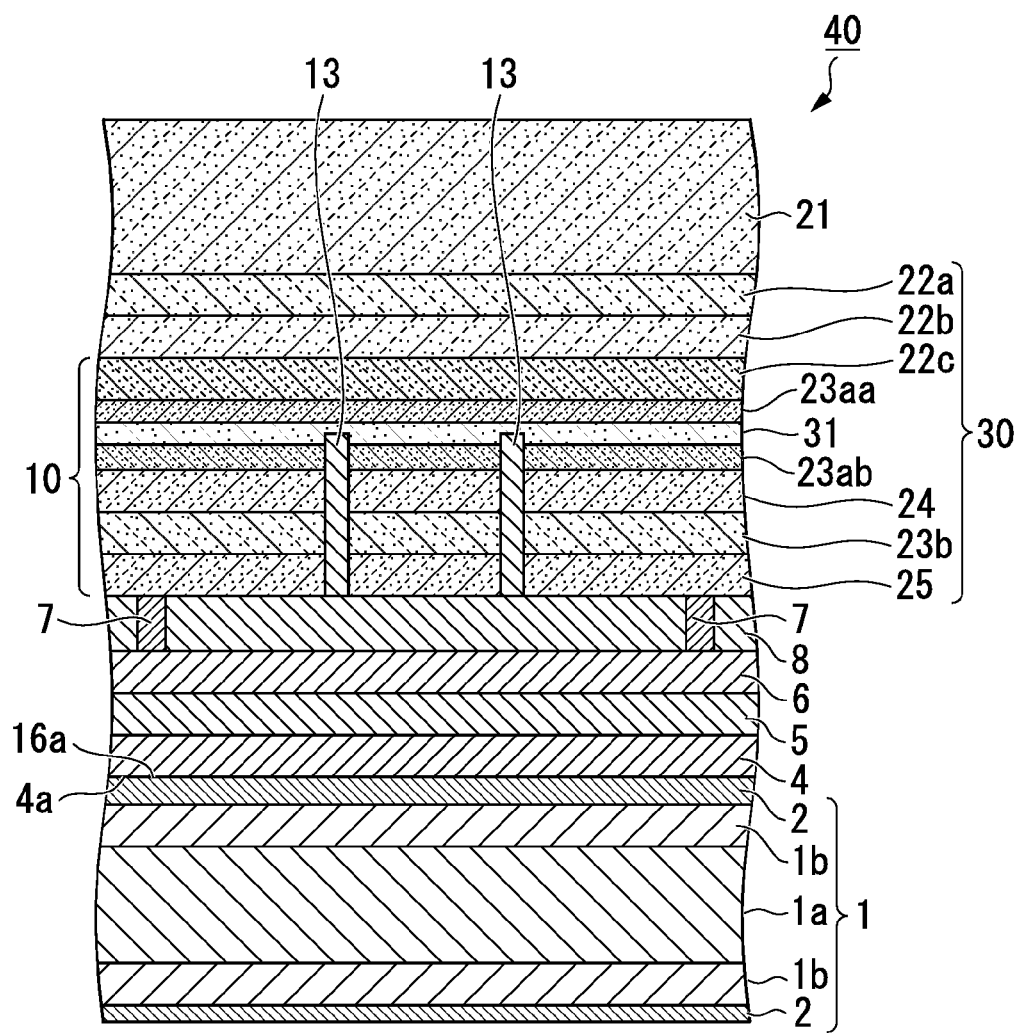
FIG. 9 is a cross-sectional schematic view for explaining one step of the method of manufacturing a light-emitting diode shown in FIG. 1, which is a cross-sectional view of a position corresponding to the sectional view shown in FIG. 1.

Specifically, as shown in FIG. 9, the semiconductor substrate 21 on which the epitaxial laminate 30, the reflection layer 6 and so on are formed, and the metal substrate 1 that was formed in the step of manufacturing the substrate are brought into a decompression device, and are arranged so as to be superposed with the bonding face 4a of the bonding layer 4 and the bonding face 1a of the metal substrate 1 such that they face each other. Next, after the decompression device has been evacuated to $3 \times 10^{-5}$ Pa, a load of 500 kg is applied in a state where the superposed metal substrate 1 and semiconductor substrate 21 have been heated to 400° C., bonding the bonding surface 4a of the bonding layer 4 and the bonding surface 1a of the metal substrate 1 together, and forming a bonding structure 40.

<Step of Removing Semiconductor Substrate and Buffer Layer>

Figure 10:
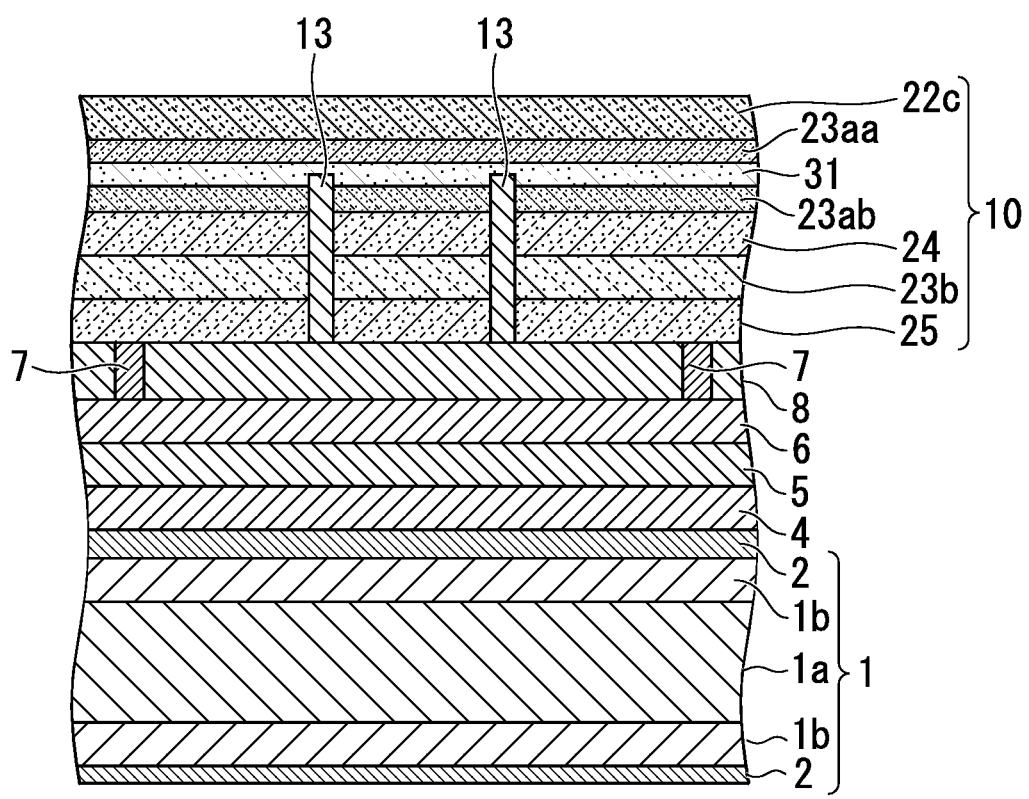
FIG. 10 is a cross-sectional schematic view for explaining one step of the method of manufacturing a light-emitting diode shown in FIG. 1, which is a cross-sectional view of a position corresponding to the sectional view shown in FIG. 1.

Next, as shown in FIG. 10, the semiconductor substrate 21 and the buffer layer 22a are selectively removed by an ammonia etchant from the bonding structure 40.

In the present embodiment, since the metal substrate 1 is covered by the metal protective layer 2, and is highly resistant to etchant for removing the semiconductor substrate 21 and the buffer layer 22a, degradation in the quality of the metal substrate when removing the semiconductor substrate 21 and the buffer layer 22a is inhibited.

<Step of Removing Substrate Etching Stop Layer>

Next, as shown in FIG. 10, the substrate etching stopper layer 22b is selectively removed by a hydrochloric etchant.

In the present embodiment, since the metal substrate 1 of the present invention is covered by the metal protective layer 2, and is highly resistant to etchant for removing the etching stopper layer 22b, degradation in the quality of the metal substrate when removing the etching stopper layer 22b is inhibited.

<Step of Forming Ohmic Electrode>

Figure 11:
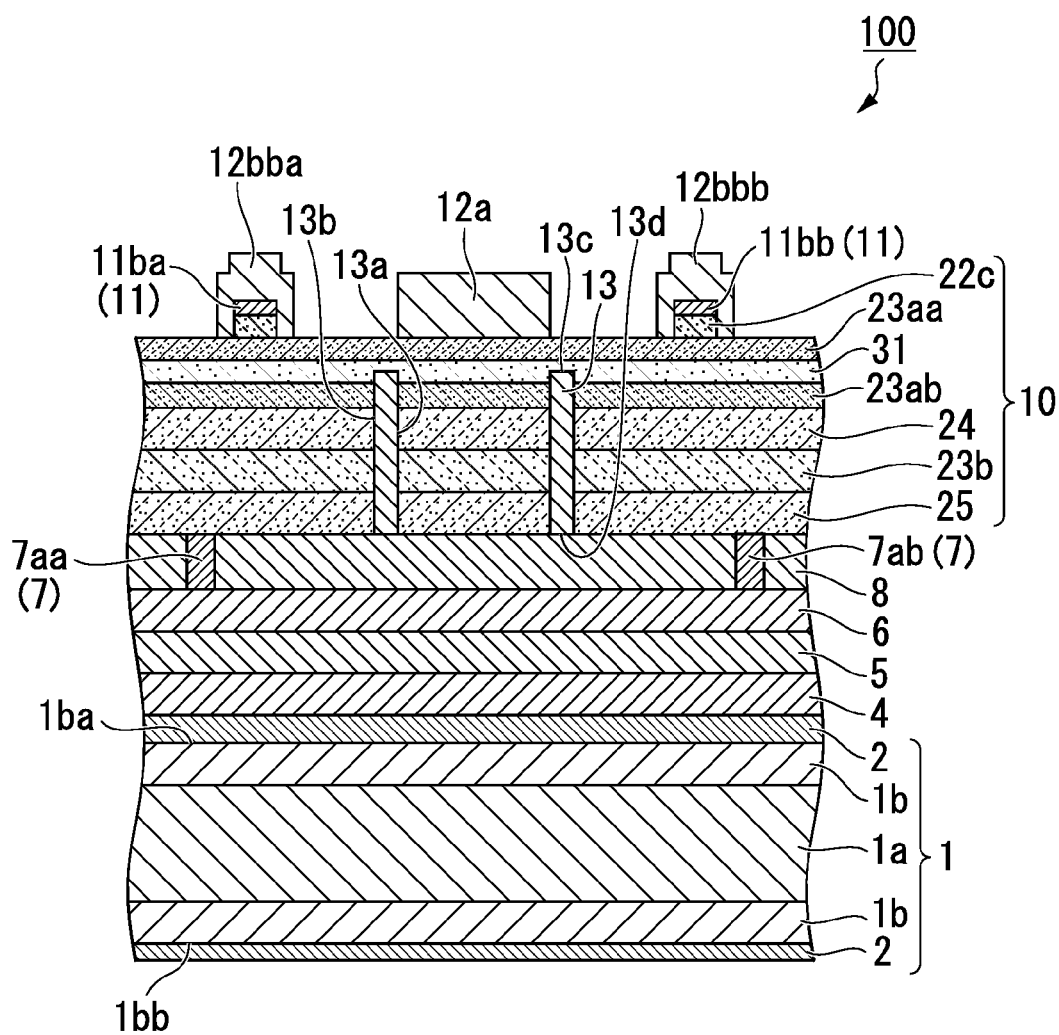
FIG. 11 is a cross-sectional schematic view for explaining one step of the method of manufacturing a light-emitting diode shown in FIG. 1, which is a cross-sectional view of a position corresponding to the sectional view shown in FIG. 1.

Next, as shown in FIG. 11, the ohmic electrodes 11 are formed on the opposite side of the compound semiconductor layer 10 with respect to the ohmic contact electrodes 7.

Specifically, on the entire surface of the contact layer 22c of the compound semiconductor layer 10, AuGeNi alloy of 0.1 μm thickness is formed over the entire surface using, for example, vapor deposition, and the AuGeNi alloy layer is subsequently patterned using photolithography and etching techniques to form ohmic electrodes 11 including 6 linear sections 11ba, 11bb, 11ca, 11cb, 11cc, and 11cd shown in FIG. 2B.

Next, using the mask formed in the aforementioned patterning of AuGeNi alloy layer as the ohmic electrode 11, the contact layer 22c except the portions overlapping the ohmic electrodes 11 in a planar view is removed by etching, for example, using a liquid mixture of ammonia water ($NH_4OH$), hydrogen peroxide ($H_2O_2$) and pure water ($H_2O$) as an etchant. By this means, the planar shape of the ohmic electrodes 11 shown in FIG. 2B is substantially the same as the planar shape of the contact layer 22c, as shown in FIG. 11.

<Step of Forming Electrode Surface>

Next, while a linear section 12b is formed so as to cover the surface of the ohmic electrode 11, a pad section 12a coupled to the linear section 12b is formed.

Specifically, over entire surface of the compound semiconductor layer 10 on which the ohmic electrode 11 is formed, an Au layer of 0.3 μm thickness, a Ti layer of 0.3 μm thickness, and an Au layer of 1 μm thickness are formed in this order using, for example, vapor deposition, and the Au/Ti/Au layer is patterned using photolithography and etching techniques.

In the present embodiment, in the step of forming the surface electrode 12, the surface electrode 12 is formed so as to provide the current-blocking portion 13 between a light-emitting layer arranged in an area except the area that overlaps the pad section in a planar view and an under-pad light-emitting layer 24a. In the present embodiment, in the step of forming the current-blocking portion 13, since the current-blocking portion 13 with an annular shape in a planar view is formed, in the step of forming the surface electrode 12, the pad section 12a is formed on the inner side of the current-blocking portion 13 in a planar view. Then, the surface electrode 12 including the pad section 12a and the branch portion 12b coupled to the pad section 12a, as shown in FIG. 2A, is formed. By the above steps, multiple light-emitting diodes 100 are formed on the metal substrate 1.

<Dividing Step>

Next, the light-emitting diodes 100 formed on the metal substrate 1 are divided. Specifically, for example, after removing the layers formed on the metal substrate 1 in the areas to be cut, the structure is cut by laser at 350 μm intervals.

<Step of Forming Metal Protective Layer on Side Face of Metal Substrate>

In each of individual light-emitting diodes 100 after the dividing step, on side face of the metal substrate 1, a metal protective layer 2 has not been formed yet. In the present embodiment, on side face of the metal substrate 1 of each individual light-emitting diode 100, a metal protective layer 2 may be formed by the same method as that forming a metal protective layer 2 on upper surface and lower surface of the metal substrate 1.

The light-emitting diode 100 of the present embodiment includes a current-blocking portion 13, which inhibits current supplied to the under-pad light-emitting layer 24a, and is arranged between a light-emitting layer arranged in an area except the area that overlaps the pad section in a planar view and an under-pad light-emitting layer 24a. It is possible to weaken the emission intensity of the portion immediately below the pad section 12a, and to reduce the light absorbed by the pad section 12a. Therefore, the light-emitting diode of the present embodiment has an excellent light extraction efficiency. In particular, it is preferably used in light-emitting diodes having a high luminance light emission by the high current drive.

In the light-emitting diodes 100 of the present embodiment, since the current-blocking portion 13 is arranged in an annular shape in a planar view, so as to surround the under-pad light-emitting layer 24a, it is possible to effectively inhibits current supplied to the pad light-emitting layer 24a. Therefore, it is possible to further weaken the emission intensity of the portion immediately below the pad section 12a, and to further reduce the light that is absorbed by the pad section 12a.

In addition, in the light-emitting diodes 100 of the present embodiment, since the current-blocking portion 13 is embedded by insulating material, when compared with the case in which the current-blocking portion is made of void, the light-emitting diode 100 has excellent strength. Specifically, when the current-blocking portion 13 is made of void, in order to increase the insulating properties of the current-blocking portion, it is necessary to widen the void. However, when widening the void, the strength of the light-emitting diode 100 is reduced. In some cases, it may be difficult to improve the insulating property of the current-blocking portion 13. On the other hand, when the current-blocking portion 13 is embedded by insulating material, it is possible to prevent the reduction in strength of light-emitting diode 100 due to formation of the current-blocking portion 13. Therefore, it is possible to improve the insulating properties of the current-blocking portion 13 by selecting a shape (spatial) of the current blocking section 13 and an appropriate insulating material for use in the current-blocking portion 13, regardless of the strength of the light-emitting diode 100.

The method of manufacturing a light-emitting diode 100 of the present embodiment including a step of forming a current-blocking portion 13 by forming void 130 by providing a recess penetrating a light-emitting layer 24 on a compound semiconductor layer 10 including a light emitting layer 24, and embedding an insulating material into the void 130; and a step of forming a surface electrode 12 including a linear section 12b and a pad section 12a. In the step of forming the surface electrode 12, the pad section 12a is formed so as to providing the current-blocking portion 13 between a light-emitting layer arranged in an area except the area that overlaps the pad section in a planar view and an under-pad light-emitting layer 24a. By the manufacturing method of the present embodiment, a light-emitting diode 100 which has an excellent light extraction efficiency and includes a current-blocking portion 13 which inhibits current supplied to the under-pad light-emitting layer 24a, and arranged between a light-emitting layer arranged in an area except the area that overlaps the pad section in a planar view and an under-pad light-emitting layer 24a is obtained.

In addition, according to a method of manufacturing a light-emitting diode 100 of the present embodiment, in the step of providing a current-blocking portion 13, a current-blocking portion 13 having an annular shape in a planar view is formed, and in the step of forming the surface electrode 12, a pad section 12a is formed on the inner side of the current-blocking portion 13 in a planar view. So, the current-blocking portion 13 is arranged annularly in a planar view so as to surround the under-pad light-emitting layer 24a. And as a result, it is possible to obtain the resulting light-emitting diode 100 in which the light absorbed by the pad section 12a is further reduced.

In addition, the method for manufacturing a light-emitting diode 100 of the present embodiment includes a step of forming an etch stop layer 31 on the semiconductor substrate 21 as a growth substrate before forming the light-emitting layer 24, and a step of providing a recess made of void 130 by etching a portion of the compound semiconductor layer 10 using the etching stop layer 31. Therefore, it is possible to form the current-blocking portion 13 with high accuracy by controlling the depth of the recess easily and absolutely and embedding an insulating material in the void 130.

In addition, the method for manufacturing a light-emitting diode 100 of the present embodiment includes a step of bonding a metal substrate 1 to the compound semiconductor layer 10 on the side of ohmic contact electrode 7 after providing the current-blocking portion 13 and forming an ohmic contact electrode 7 on compound semiconductor layer 10. Therefore, the quality of the metal substrate 1 is not degraded due to the etching step for providing the current-blocking portion 13. It is preferable.

Second Embodiment

[Light-Emitting Diode]

Figure 4:
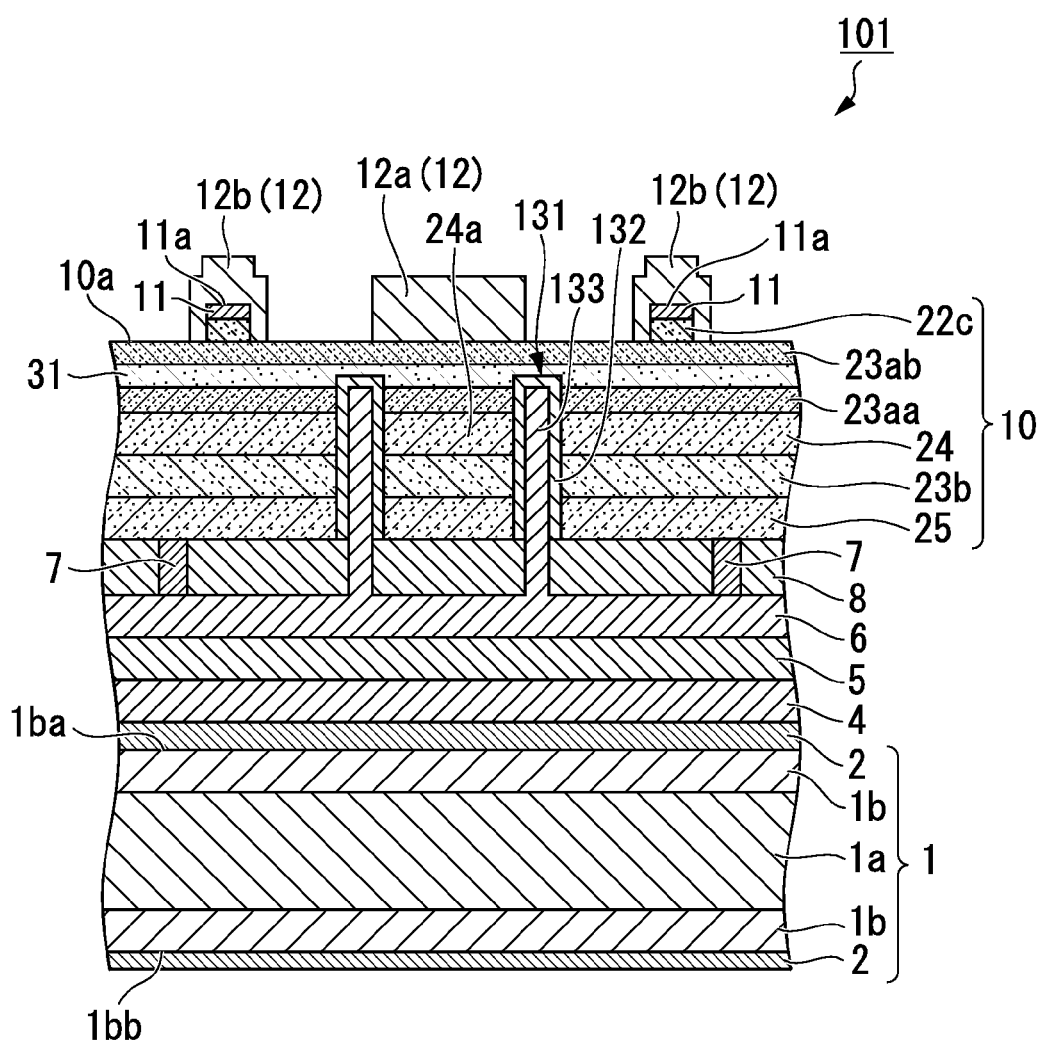
FIG. 4 is a cross-sectional schematic view showing another example of the light-emitting diode of the present invention.

FIG. 4 is a cross-sectional schematic view showing another example of the light-emitting diode of the present invention. The only difference between the light-emitting diode 100 shown in FIG. 1 and the light-emitting diode 101 shown in FIG. 4 is a current-blocking portion 131. Therefore, in the present embodiment, only the current-blocking portion 131 is described, and description about the other members is omitted.

As a bonding substrate, as described above, the substrate made from a material having a thermal expansion coefficient close to the growth substrate is preferable. For example, a Ge substrate, a GaP substrate, a GaAs substrate and a metal substrate having an adjusted thermal expansion coefficient may be used.

The current-blocking portion 131 of the light-emitting diode 101 of the present embodiment, as shown in FIG. 4, includes a reflection layer 133, and a translucent insulating material layer 132. The translucent insulating material layer 132 is, as shown in FIG. 4, arranged between a reflection layer 133 and a compound semiconductor layer 10. The reflection layer 133 shown in FIG. 4 is formed by penetrating the translucent layer 8, and integrated with the reflection layer 6.

A reflective material of the reflection layer 133 of the current-blocking portion 131 is not limited, and it is preferable that a high reflectivity of 90% or more is obtained. Specifically, for example, Au, Ag, Al, Cu, APC (AgPdCu alloy) may be used. In addition, it is preferable that the reflection layer 133 of the current blocking section 131 uses the same material as the reflection layer 6. When the reflection layer 133 of the current blocking section 131 uses the same material as the reflection layer 6, it is possible to form the reflection layer 133 at the same time as the reflection layer 6. It is excellent in productivity.

In addition, a translucent insulating material used in the translucent insulating material layer 132 of the current-blocking portion 131 is not limited, as long as it can maintain a light-emitting layer arranged in an area except the area that overlaps the pad section in a planar view and an under-pad light-emitting layer 24a to be insulated. For example, $SiO_2$, $Si_3N_4$, $TiO_2$, TiN or the like may be used. In addition, it is preferable that the material of the translucent insulating material layer 132 of the current-blocking portion section 131 is the same as the material of the translucent layer 8. When the material of the translucent insulating material layer 132 of the current-blocking portion section 131 is the same as the material of the translucent layer 8, it is possible to form the translucent insulating material layer 132 at the same time as the translucent layer 8. It is excellent in productivity.

In addition, a thickness of the translucent insulating material layer 132 of the current-blocking portion 131 (distance between the reflection layer 133 and the light-emitting layer 24) may be determined suitably according to material of the translucent insulating material layer 132 and material of the reflection layer 133. When the reflection layer 133 is conductive, 0.05 μm or more is preferable, and 0.2 μm or more is more preferable.

When the current-blocking portion 131 includes the translucent insulating material layer 132 which is arranged by surrounding the reflection layer 133 in a planar view in the compound semiconductor layer, regarding a distance between the inner wall 13a and the outer wall 13b, 0.2 μm or more is preferable, and 1.0 μm or more is more preferable. When the distance between the inner wall (corresponding to the inner wall 13a in FIG. 1) and the outer wall (corresponding to the outer wall 13b of FIG. 1) is 0.2 μm or more, even if the reflection layer 133 has conductivity, it is possible to maintain a sufficient thickness of the translucent insulating material layer 132 and maintain a light-emitting layer arranged in an area except the area that overlaps the pad section in a planar view and an under-pad light-emitting layer 24a insulated from each other effectively. In addition, in order that a light-emitting layer arranged in an area except the area that overlaps the pad section in a planar view has enough area to obtain a sufficient brightness, it is preferable that a distance between two inner walls (corresponding to the inner wall 13a of FIG. 1) (area surrounded by the farthest inner walls of the annular recess) be 30 μm or less, and 10 μm or less is more preferable.

In the present embodiment, since the current-blocking portion 131 is arranged between a light-emitting layer arranged in an area except the area that overlaps the pad section in a planar view and an under-pad light-emitting layer 24a, it is possible to prevent current supplied to the under-pad light-emitting layer 24a, and to weaken the emission intensity of the portion immediately below the pad section 12a. As a result, it is possible to avoid the deterioration of light extraction efficiency due to absorbing light by the pad section 12a. Thus, according to the light-emitting diodes 101 of the present embodiment, it is possible to obtain the light extraction efficiency excellent.

In addition, since the light-emitting diodes 101 of the present embodiment includes the current-blocking portion 131, the reflection layer 133, and the translucent insulating material layer 132 arranged between the compound semiconductor layer 10 and the reflection layer 133, the light emitted from a light-emitting layer arranged in an area except the area that overlaps the pad section in a planar view is reflected by the reflection layer 133 of the current-blocking portion 131, and then the light is inhibited from directly entering into the portion immediately below the pad section 12a. Therefore, according to the light-emitting diode 101 of the present embodiment, it is possible to obtain even better light extraction efficiency.

[Method of Manufacturing Light-Emitting Diode]

As shown in FIG. 4, an example of a method of manufacturing a light-emitting diode 101 will be explained.

In the method for manufacturing the light-emitting diode 101 of the present embodiment, only steps that are different from the method of manufacturing a light-emitting diode 100 shown in FIG. 1 are explained.

As shown in FIG. 4 in order to manufacture the light-emitting diode 101, steps before a step of forming a current-blocking portion are performed in the same manner as the method of manufacturing the light-emitting diode 100 shown in FIG. 1.

In the step of forming the current-blocking portion 131, firstly, in the same manner as the method of manufacturing the light-emitting diode 100 shown in FIG. 1, a groove, which has an approximately circular annular shape in a planar view and a bottom face 130a reaching an etch stop layer 31, is arranged so as to surrounding the under-pad light-emitting layer 24a. As a result, the void 130 (recess) shown in FIG. 7A is formed between a light-emitting layer arranged in an area except the area that overlaps the pad section in a planar view and an under-pad light-emitting layer 24a.

Then, a translucent insulating material is deposited on the inner wall and bottom of the void 130 which is obtained in this manner. In the present embodiment on the entire surface of the current diffusion layer 25, for example, a $SiO_2$ layer is formed using the CVD method, and as a result, at the same time of forming a translucent layer 8, the translucent insulating material layer 132 is formed on the inner wall of the void 130.

Then, in the same manner as the method of manufacturing the light-emitting diode 100 shown in FIG. 1, an ohmic contact electrode 7 is formed. Then, the reflection layer 133 is formed in the void 130 by embedding a metal material for the reflection layer 6 into the void 130 via the translucent insulating material layer 132 at the same time of forming a reflection layer 6 made from APC or Au on the ohmic contact electrode 7 and the translucent layer 8.

Then, in the same manner as the method of manufacturing the light-emitting diode 100 shown in FIG. 1, steps before the step of dividing the light-emitting diode 101 are performed.

In the same manner as the first embodiment, the light-emitting diode 101 of the present embodiment includes the current-blocking portion 131 which inhibits current supplied to the under-pad light-emitting layer 24a and is arranged between a light-emitting layer arranged in an area except the area that overlaps the pad section in a planar view and an under-pad light-emitting layer 24a. It is possible to weaken the emission intensity of the portion immediately below the pad section 12a, and to reduce the light absorbed by the pad section 12a. Therefore, the light-emitting diode of the present embodiment has an excellent light extraction efficiency.

In the light-emitting diodes 101 of the present embodiment, since the current-blocking portion 131 includes the reflection layer 133, and a translucent insulating material layer 132 formed between the reflection layer 133 and the compound semiconductor layer 10, it is possible to prevent the light of the light-emitting layer 24 from entering into the portion under the pad section 12a by the reflection layer. As a result, it is possible to further weaken light that is absorbed by the pad section 12a, and to obtain a better light extraction efficiency.

The method of manufacturing the light-emitting diode 101 of the present embodiment includes the steps of forming the void 130 by providing a recess penetrating a light-emitting layer 24 in a compound semiconductor layer 10 including a light emitting layer 24; providing the current-blocking portion 131 by embedding an insulating material into the void 130, forming the translucent insulating material layer 132 on the inner wall and bottom face of the void 130, and embedding the reflection layer 133 made of a reflective material into the void surrounded by the translucent insulating material layer 132; and forming a surface electrode 12 including a linear section 12b and a pad section 12a. In the step of forming the surface electrode 12, the pad section 12a is arranged so as to provide the current-blocking portion 131 between a light-emitting layer arranged in an area except the area that overlaps the pad section in a planar view and an under-pad light-emitting layer 24a. By the manufacturing method of the present embodiment, the light-emitting diode 101 which has an excellent light extraction efficiency and includes the current-blocking portion 131 which inhibits current supplied to the under-pad light-emitting layer 24a and is arranged between a light-emitting layer arranged in an area except the area that overlaps the pad section in a planar view and an under-pad light-emitting layer 24a is obtained.

Third Embodiment

[Light-Emitting Diode]

Figure 12:
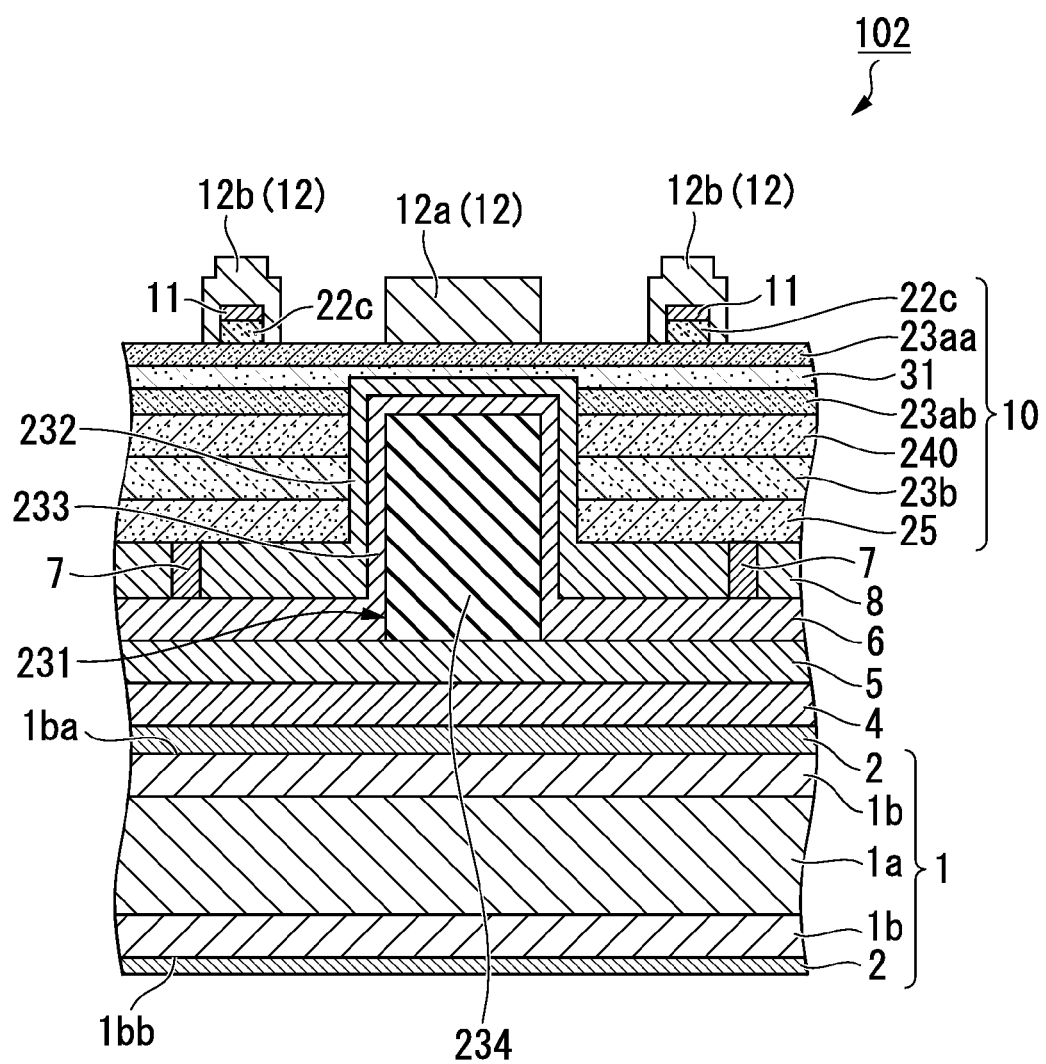
FIG. 12 is a cross-sectional schematic view showing another example of the light-emitting diode of the present invention.

FIG. 12 is a cross-sectional schematic view showing another example of the light-emitting diode of the present invention. The only differences between the light-emitting diode 102 shown in FIG. 12 and the light-emitting diode 100 shown in FIG. 1 is the clad layer 23ab of the compound semiconductor layer 10, the light-emitting layer 240, a clad layer 23b, a current diffusion layer 25, and the planar shape of the current-blocking portion. Therefore, in the present embodiment, only differences from the light-emitting diode 100 shown in FIG. 1 are described, and description about the other members is omitted.

As a bonding substrate, as described above, the substrate made from a material having a thermal expansion coefficient close to the growth substrate is preferable. For example, a Ge substrate, a GaP substrate, a GaAs substrate and a metal substrate having an adjusted thermal expansion coefficient may be used.

The light-emitting diode 102 shown in FIG. 12, as the same as those of the light-emitting diode shown in FIG. 1, includes a compound semiconductor layer 10, a ohmic contact electrode 7, a ohmic electrode 11, and a surface electrode 12 including a linear section 12b, and a pad section 12a.

However, the light-emitting diode 102 shown in FIG. 12, different from the light-emitting diode 100 shown in FIG. 1, includes a light-emitting layer 240 which is formed only in an area not overlapping the pad section 12a in a planar view, and is not formed in an area overlapping the pad section 12a in a planar view. In addition, the light-emitting diode 102 shown in FIG. 12, different from the light-emitting diode 100 shown in FIG. 1, includes a current-blocking portion 231 formed in an area overlapping the pad section 12a in a planar view. As shown in FIG. 12, the light-emitting layer 240 is formed so as to surround the current-blocking portion 231.

In the present embodiment, the planar shape of the current-blocking portion 231 is a substantially concentric shape larger than the planar shape of the pad section 12a. However, the planar shape of the current-blocking portion 231 may at least be a part of an overlapping area in a planar view between the current-blocking portion section 231 and the pad section 12a. The planar shape of the current-blocking portion 231 may the same as that of the pad section 12a, or may be larger or smaller than that of the pad section 12a.

The current-blocking portion section 231, as shown in FIG. 12, includes a embedding layer 234, a reflection layer 233, and a translucent insulating material layer 232. As shown in FIG. 12, the translucent insulating material layer 232 is formed between the reflection layer 233 and the compound semiconductor layer 10. The reflection layer 233 is formed penetrating the translucent layer 8, and is integrated with the reflection layer 6. In addition, the reflection layer 233 has a shape of recess having an opening on the side of the metal substrate 1. The embedding layer 234 is embedded into the recess formed by the reflection layer 233. In the embodiment shown in FIG. 12, the embedding layer 234 is formed by penetrating the reflection layer 6. It is preferable that the embedding layer 234 is integrally formed with the reflection layer 233 (In this case, the embedding layer 234 are also integrated with the reflection layer 6).

A reflective material to be used for the reflection layer 233 of the current-blocking portion section 231 is not limited, however, it is preferable that the material has a high reflectivity of 90% or more. Specifically, for example, Au, Ag, Al, Cu APC (AgPdCu alloy) may be used. In addition, it is preferable that the material for the reflection layer 233 of the current-blocking portion 231 be the same as the material of the reflection layer 6.

When the material for the reflection layer 233 of the current-blocking portion 231 is the same as the material of the reflection layer 6, it is possible that the reflection layer 233 is formed at the same time as the reflection layer 6. It is excellent in productivity.

In addition, a translucent insulating material used for the translucent insulating material layer 232 of the current-blocking portion section 231 is not particularly limited as long as it may insulate the reflection layer 233 with the compound semiconductor layer 10. For example, $SiO_2$, $Si_3N_4$, $TiO_2$, TiN or the like may be used. In addition, it is preferable that the material of the translucent insulating material layer 232 of the current-blocking portion 231 is the same as the material of the translucent layer 8. When the material of the translucent insulating material layer 232 of the current-blocking portion 231 is the same as the material of the translucent layer 8, it is possible that the translucent insulating material layer 232 is formed at the same time with the translucent layer 8. It is excellent in productivity.

A material of the embedding layer 234 of the current-blocking portion 231 is not particularly limited. For example, $SiO_2$, $Si_3N_4$, $TiO_2$, TiN or a metal such as Au, Ag, Al, Cu, APC, Pt, Ni, Ti or the like may be used. In addition, void may be used.

[Method of Manufacturing Light-Emitting Diode]

As shown in FIG. 12, an example of a method of manufacturing the light-emitting diode 102 will be explained.

In the method for manufacturing the light-emitting diode 102 of the present embodiment, only steps that are different from the method of manufacturing a light-emitting diode 100 shown in FIG. 1 are explained.

As shown in FIG. 12 in order to manufacture the light-emitting diode 102, steps before a step of forming a current-blocking portion 231 are performed in the same manner as the method of manufacturing the light-emitting diode 100 shown in FIG. 1.

In the step of forming the current-blocking portion 231, the current-blocking portion 231 made of void (recess) penetrating the light-emitting layer 240 is formed immediately below the pad section 12a in a planar view in the compound semiconductor layer 10 by dry etching and wet etching in this order. Specifically, the recess is formed in an area of the light-emitting layer 240 that overlaps the pad section 12a in a planar view by the same method as that for manufacturing a light-emitting diode shown in FIG. 1.

Then, a translucent insulating material is deposited on a bottom and an inner wall of the void. In the present embodiment over the entire surface of the current diffusion layer 25, for example, a $SiO_2$ layer is formed using the CVD method, and as a result, at the same time of forming a translucent layer 8, a translucent insulating material layer 232 is formed on the inner wall of the void.

Next, in the same manner as the method of manufacturing the light-emitting diode 100 shown in FIG. 1, the ohmic contact electrode 7 is formed.

Then, on the ohmic contact electrode 7 and the translucent layer 8, for example, using a vapor deposition method, at the same time of forming the reflection layer 6 made of APC or Au, the reflection layer 233 is formed in the void by embedding a metal material of the reflection layer 233 into the void (recess) surrounded by the translucent insulating material layer 232 via the translucent insulating material layer 232. Then, the current-blocking portion 231 is provided by forming the embedding layer 234 on the reflection layer 233 so as to fill the void. The embedding layer 234 may be formed by a CVD method or the like using a photoresist pattern having an opening portion corresponding to the embedding portion as a mask. In addition, when the embedding layer 234 is formed from a metal, it is also possible to use a plating method.

When the embedded layer 234 is formed using the same material as the reflection layer 6, the material may be embedded into the recess at the same time of forming a reflection layer 6.

In addition, when the embedding layer 234 is made of void, after forming a reflection layer 233, the bonding layer 5 and the barrier layer 6 are formed in this order.

Then, in the same manner as the method of manufacturing the light-emitting diode 100 shown in FIG. 1, steps before forming a surface electrode 12 are performed. In the step of forming the surface electrode 12, a pad section 12a is formed in an area overlapping the current-blocking portion section 231 in a planar view.

Then, in the same manner as the method of manufacturing the light-emitting diode 100 shown in FIG. 1, the steps before the step of dividing the light-emitting diode 102 are performed.

In the light-emitting diodes 102 of the present embodiment, since the light-emitting layer 240 is formed only in the area not overlapping the pad section 12a in a planar view, the portion immediately below the pad section 12a does not emit light. It is possible to reduce the light absorbed by the pad section 12a and to obtain a better light extraction efficiency.

In addition, in the light-emitting diodes 102 of the present embodiment since the light-emitting layer 240 of the present embodiment is arranged so as to surround the current-blocking portion section 231 which is arranged in the area overlapping the pad section 12a in a planar view, the light-emitting diodes 102 may be easily produced by forming the current-blocking portion section 231, for example, by removing the portion of the compound semiconductor layer corresponding to the area to be the current-blocking portion 231.

The method of manufacturing a light-emitting diode 102 of the present embodiment includes steps of forming a current-blocking portion 231 by forming void 130 by providing a recess penetrating a light-emitting layer 240 in a compound semiconductor layer 10 including a light emitting layer 240, forming a translucent insulating material layer 232 on the inner wall and bottom face of the void 130, and embedding a reflection layer 233 made of a reflective material into the void surrounded by the translucent insulating material layer 232; and forming a surface electrode 12 including a linear section 12b and a pad section 12a. In the step of forming the surface electrode 12, the pad section 12a is formed in the area overlapping the current-blocking portion 231 in a plan view. Therefore, by the manufacturing method of the present embodiment, since the pad section 12a is formed in the area overlapping the current-blocking portion 231 in a plan view and the light-emitting layer 240 is formed in an area not overlapping the pad section 12a in a planar view, it is possible to obtain the light-emitting diode 102 having an excellent light extraction efficiency.

In addition, since the method of manufacturing a light-emitting diode 102 of the present embodiment includes steps of bonding the compound semiconductor layer 10 to the metal substrate 1 on a side of the ohmic contact electrode 7, after forming the current-blocking portion 231 in the compound semiconductor layer 10 and forming the ohmic contact electrode 7 on the compound semiconductor layer 10, the quality of the metal substrate 1 is not deteriorated by etching for forming the current-blocking portion 231. It is preferable.

Light-Emitting Diode Lamp

A light-emitting diode lamp of the present embodiment is obtained by mounting (die bonding) any one of the light-emitting diodes of the first to third embodiments as described above on the mounting board. Since the light-emitting diode lamp of the present embodiment includes light-emitting diodes having excellent light extraction efficiency, the light-emitting diode lamp has a high luminance.

Illumination Device

An illumination device of the present embodiment is obtained by including multiple the light-emitting diode lamps obtained by mounting (die bonding) any one of the light-emitting diodes of the first to third embodiments as described above on the mounting board. Since the illumination device of the present embodiment includes the multiple light-emitting diodes having excellent light extraction efficiency, the illumination device has a high luminance.

EXAMPLES

The present invention is explained in detail below based on Examples. However, the present invention is not limited to these Examples.

Example 1

A light-emitting diode lamp including the light-emitting diode 100 shown in FIG. 1 was manufactured, and the properties thereof were evaluated.

<Step of Forming Metal Substrate>

An Mo layer (foil or sheet) of 75 µm thickness was interposed between two Cu layers (foils or sheets) of 10 µm thickness, and thermal compression was conducted to form a metal plate (before cutting for division) of 95 µm thickness. The top surface and bottom face of this metal plate were polished, and then cleaning was conducted with organic solvent to remove impurities.

Next, a 2 µm Ni layer and a 1 µm Au layer were formed in this order as a metal protection layer over the entire surface of this metal plate by an electroless plating method to fabricate the metal substrate 1 (metal substrate before cutting for division).

<Step of Forming Compound Semiconductor Layer>

Next, a compound semiconductor layer 10 was sequentially laminated onto a semiconductor substrate 21 (growth substrate) having a diameter of 50 mm and a thickness of 350 µm composed of Si-doped n-type GaAs single crystal to fabricate an epitaxial laminate 30 with a light-emission wavelength of 620 nm. With respect to the semiconductor substrate 21, the surface inclined at 15° in the (0-1-1) direction from the (100) surface was the growth surface, and the carrier concentration thereof was set at $1\times10^{18}$ cm$^{-3}$.

The compound semiconductor layer 10 includes a buffer layer 22a composed of Si-doped n-type GaAs, the etching stop layer 22b composed of Si-doped $(Al_{0.5}Ga_{0.5})_{0.5}In_{0.5}P$, a n-type contact layer 22c composed of Si-doped GaAs, a surface roughened layer 23aa composed of Si-doped n-type $(Al_{0.5}Ga_{0.5})_{0.5}In_{0.5}P$, an etching stop layer 31 composed of n-type Si-doped $(Al_{0.7}Ga_{0.3})_{0.5}As$, a clad layer 23ab composed of Si-doped n-type $Al_{0.5}In_{0.5}P$, a light-emitting layer 24 formed by laminating alternately 20 layers of well layers composed of $(Al_{0.1}Ga_{0.9})_{0.5}In_{0.5}P$ and 19 layers of barrier layers composed of $(Al_{0.5}Ga_{0.5})_{0.5}In_{0.5}P$, a clad layer 23b composed of p-type $Al_{0.5}In_{0.5}P$, and a current diffusion layer 25 composed of Mg-doped p-type GaP.

With respect to the buffer layer 22a, the carrier concentration thereof was set at approximately $1\times10^{18}$ cm$^{-3}$, and the layer thickness was set at approximately 0.5 µm. With respect to the substrate etching stop layer 22b, the carrier concentration thereof was set at approximately $1\times10^{18}$ cm$^{-3}$, and the layer thickness was set at approximately 0.5 µm. With respect to the contact layer 22c, the carrier concentration thereof was set at approximately $1\times10^{18}$ cm$^{-3}$, and the layer thickness was set at approximately 0.05 µm. With respect to the surface roughened layer 23aa, the carrier concentration thereof was set at approximately $1\times10^{18}$ cm$^{-3}$, and the layer thickness was set at approximately 3 µm. With respect to the etch stop layer 31, the carrier concentration thereof was set at approximately $1\times10^{18}$ cm$^{-3}$ and the layer thickness was set at approximately 1.0 µm. With respect to the clad layer 23ab, the carrier concentration thereof was set at approximately $2\times10^{18}$ cm$^{-3}$, and the layer thickness was set at approximately 0.5 µm. With respect to the well layer and the barrier layer of the light-emitting layer 24, undoped layer thickness was approximately 5 nm. With respect to the clad layer 23ab, the carrier concentration thereof was approximately $8\times10^{17}$ cm$^{-3}$, and the layer thickness was approximately 0.5 µm. With respect to the current diffusion layer 25, the carrier concentration thereof was approximately $5\times10^{18}$ cm$^{-3}$, and the layer thickness was approximately 3 µm.

In the present example, the epitaxial laminate 30 was formed by epitaxially growing the compound semiconductor layer 10 on a semiconductor substrate 21 using a pressure-reducing metal organic chemical vapor deposition method (MOCVD apparatus). Trimethyl aluminum (($CH_3)_3Al$), trimethyl gallium (($CH_3)_3Ga$), and trimethyl indium (($CH_3)_3$n) were used as the raw material of group-III constituent elements. As the Mg doping raw material, bis-cyclopentadienyl magnesium (bis-$(C_5H_5)_2Mg$) was used. As the Si-doping raw material, disilane ($Si_2H_6$) is used. As the raw material of group-V constituent elements, phosphine ($PH_3$) and arsine ($AsH_3$) were used.

The current diffusion layer 25 was grown at 750° C. Each of the other layers was grown at 700° C.

Next, a surface 25a of the current diffusion layer 25 on a side opposite to the semiconductor substrate 21 was polished from the surface to a region reaching a depth of approximately 2 µm, and subjected to specular finishing. As a result of this specular finishing, the roughness of the surface of the current diffusion layer was set at 0.18 nm.

<Step of Forming Current-Blocking Portion>

A groove, which has an approximately circular annular shape in a planar view and a bottom 130a reaching an etch stop layer 31, was arranged so as to surrounding the under-pad light-emitting layer 24a by etching a portion of the compound semiconductor layer 10. As a result, the void 130 (recess) was formed between a light-emitting layer arranged in an area except the area that overlaps the pad section in a planar view and an under-pad light-emitting layer 24a.

An inner wall 13a of the void 130 was arranged to overlap the edge of the pad section 12a in a planar view, and an outer wall 13b of the void 130 was arranged at the outside of the pad section 12a in a planar view so as to be opposed to the inner wall 13a and be substantially parallel with the inner wall 13a of the void 130. The inner wall 13a of the void 130 has a circular shape in a planar view with a diameter of 100 µm, and the outer wall 13b of the void 130 has a circular shape in a planar view with a diameter of 110 µm. The distance between the inner wall 13a and the other wall 13a was 5 µm.

The etching method for forming the void 130 used both of a dry etching method and a wet etching method. Specifically, a resist layer was selectively formed in an area except the area to become the void in a planar view using a photolithography technique. And then, etching to a depth of 2 to 4 µm was performed by dry etching method using $SiCl_4$ as an etching gas and under the conditions of bias 50 W and 10 min. After the dry etching, etching to the etch stop layer was performed by a wet etching method using 1:1 diluted hydrochloric acid at 40° C.

Then, a current-blocking portion 13 was formed by embedding an insulating material in the void 130 at the same time of forming the translucent layer 8 of 0.3 µm thickness by forming a $SiO_2$ layer by a CVD method over the entire surface of the current diffusion layer 25.

<Step of Forming Ohmic Contact Electrode>

Then, multiple through-holes into which conductive members constituting the ohmic contact electrode 7 were to be embedded were formed in the translucent layer 8 by photolithography and etching techniques. Next, using a vapor deposition method, cylindrical ohmic contact electrodes 7 having a height of 0.3 µm and a diameter of 9 µm were formed by embedding AuBe alloy into multiple through-holes of the translucent layer 8 in the compound semiconductor layer 10. In addition, the ohmic contact electrode 7 was formed at the position at which the shortest distance between the ohmic contact electrode 7 and the conductive member closest to the pad section 12a of the electrode surface 12 was 10 µm.

<Steps of Forming Reflection Layer, Barrier Layer and Bonding Layer>

Next, the reflecting layer 6 composed of Au layer of 0.7 µm thickness was formed on the ohmic contact electrodes 7 and the transparent layer 8 using vapor deposition. Next, the barrier layer 5 composed of Ti layer of 0.5 µm thickness was formed on the reflecting layer 6 using vapor deposition. Next, the bonding layer 4 composed of AuGe layer of 1.0 µm thickness was formed on the barrier layer 5 using vapor deposition.

<Steps of Bonding of Metal Substrate, and Removing Semiconductor Substrate, Buffer Layer and Substrate Etch Stop Layer>

Then, the semiconductor substrate 21 on which the epitaxial laminate 30 and the reflection layer 6 or the like were formed and the metal substrate 1 were brought into a decompression device, and then placed in a superposition manner so as to make the metal substrate 1 to face the bonding surface 4a of the bonding layer 4. Then, after evacuating the decompression device to $3\times10^{-5}$ Pa, the superposed semiconductor substrate 21 and the metal substrate 1 were bonded with a load of 500 kg weight while be heated to 400° C. to form a bonded structure 40.

Next, the compound semiconductor layer 10 including the light-emitting layer 24 was obtained by removing the semiconductor substrate 21 and the buffer layer 22a selectively from the bonded structure 40 by an ammonia etchant, and also removing the substrate etching stop layer 22b selectively by a hydrochloric etchant.

<Step of Forming Ohmic Electrode>

Next, the ohmic electrodes 11 including six linear sections of 11ba, 11bb, 11ca, 11cb, 11cc, 11cd shown in FIG. 2B were formed by forming a AuGeNi alloy layer of 0.1 µm thickness over the entire surface of the contact layer 22c of the compound semiconductor layer 10 using a vapor deposition method, and then patterning the AuGeNi alloy layer using photolithography and etching techniques.

The width of each the six linear sections was 4 µm, the length of the linear sections 11ba and 11bb was 270 µm, and the length of the linear sections 11ca, 11cb, 11cc, and 11cd was 85 µm.

In addition, the closest distance between the linear sections 11ba, 11bb and the pad section 12a of the surface electrode 12 was set to 45 µm, and the closest distance between the linear sections 11ca, 11cb, 11cc, 11cd and the pad section 12a of the surface electrode 12 was set to 10 µm.

The closest distance between the linear sections 11ba, 11bb and the pad section 12a of the surface electrode was consistent with the length of the first linear sections 12baa, 12bab of the surface electrode 12.

Then, the contact layer 22c was patterned to substantially the same planar shape as that of the ohmic electrode 11 by removing the contact layer 22c except the area overlapping the ohmic electrode 11 in a planar view by etching using a mixed solution of aqueous ammonia ($NH_4OH$), hydrogen peroxide ($H_2O_2$) and pure water ($H_2O$) using the mask formed when patterning the AuGeNi alloy layer as the ohmic electrode 11.

<Step of Forming Surface Electrode>

The surface electrode 12 was formed by forming an Au layer of 0.3 µm thickness, a Ti layer of 0.3 µm thickness, an Au layer of 1 µm thickness in this order over the entire surface of the compound semiconductor layer 10 on which the ohmic electrode 11 was formed using a vapor deposition method, and then patterning the Au/Ti/Au layer using photolithography and etching techniques.

The pad section 12a having a circular shape in a planar view with a diameter of 100 µm was formed inside the current-blocking portion 13 in a planar view. The width of the linear sections 12b including both the first linear sections and the second linear sections was 8 µm. The length of the first linear sections 12baa and 12bab was 43 µm, the length of the second linear sections 12bba and 12bbb was 270 µm, and the length of the second linear sections 12bca, 12bcb, 12bcc, and 12bcd was 100 µm.

Multiple light-emitting diodes 100 were formed on the metal substrate 1 by the above steps.

<Dividing Step>

Next, the multiple light-emitting diodes 100 formed on the metal substrate 1 were divided by removing the layers formed on the metal substrate 1 on the planned cutting portions for purposes of separation into chips, and dicing the metal substrate 1 into a square shape at a pitch of 350 µm by laser dicing. Next, the light-emitting diode chips fabricated in the foregoing manner were mounted onto mounting substrates, and assembled into a light-emitting diode lamp of Example 1.

Next, the properties of the lamp including the light-emitting diodes 100 of Example 1 shown in FIG. 1 were evaluated.

When current flows between the ohmic contact electrode 7 and the ohmic electrode 11, the red light having a dominant wavelength of 620 nm was emitted. Forward voltage ($V_F$) was 1.95 V when current of 20 milliamperes (mA) flowed in the forward direction. Light-emitting output was 9.44 mW when the forward current was 20 mA.

Example 2

A light-emitting diode lamp including light-emitting diodes 101 shown in FIG. 4 is manufactured, and the properties thereof were evaluated.

Firstly, steps before a step of forming a current-blocking portion 131 were performed in the same manner as the method of manufacturing the light-emitting diode 100 of Example 1.

In a step of forming the current-blocking portion 131, void 130 was formed in the same manner as the method of manufacturing a light-emitting diode 100 of Example 1. The inner wall 13a of the void 130 had a circular shape in a planar view with a diameter of 100 µm, and the outer wall 13b of the void 130 had a circular shape in a planar view with a diameter of 120 µm. The distance between the inner wall 13a and the other wall 13a was 10 µm.

Then, a translucent insulating material layer 132 was formed on the inner wall of the void 130 at the same time of forming the translucent layer 8 by forming a $SiO_2$ layer by a CVD method over the entire surface of the current diffusion layer 25. The inner wall of the void 130 on which the translucent insulating material layer 132 was formed has a circular shape in a planar view with a diameter of 10 µm Then, an ohmic contact electrode 7 was formed in the same manner as the method of manufacturing a light-emitting diode 100 of Example 1. Then, on the ohmic contact electrode 7 and the translucent layer 8, in the void 130 in which the translucent insulating material layer 132 was formed, a reflection layer 133 was formed using a vapor deposition method at the same time of forming a reflection layer 6 composed of Au.

Then, a dividing step was performed in the same manner as the method of manufacturing a light-emitting diode 100 of Example 1. And then, a light-emitting diode lamp of Example 2 was obtained by mounting divided light-emitting diodes 101 on a mount substrate.

Next, the properties of the lamp including the light-emitting diodes 101 of Example 2 shown in FIG. 4 were evaluated.

When current flows between the ohmic contact electrode 7 and the ohmic electrode 11, the red light having a dominant wavelength of 620 nm was emitted. Forward voltage ($V_F$) was 1.95 V when current of 20 milliamperes (mA) flowed in the forward direction. Light-emitting output was 9.60 mW when the forward current was 20 mA.

Example 3

Steps before a dividing step were performed in the same manner as the method of manufacturing the light-emitting diode 100 of Example 1, except that the current-blocking portion made of void was provided without being embedded with the insulating material. And then, a light-emitting diode lamp of Example 3 was obtained by mounting divided light-emitting diodes on a mount substrate.

Next, the properties of the lamp including light-emitting diodes of Example 3 shown in FIG. 4 were evaluated.

When current flows between the ohmic contact electrodes 7 and the ohmic electrode 11, the red light having a dominant wavelength of 620 nm was emitted. Forward voltage ($V_F$) was 1.95 V when current of 20 milliamperes (mA) flowed in the forward direction. Light-emitting output was 9.44 mW when the forward current was 20 mA.

Example 4

A light-emitting diode lamp including light-emitting diodes 102 shown in FIG. 12 were manufactured and the properties thereof were evaluated.

Firstly, steps before a step of forming the current-blocking portion 231 were performed in the same manner as the method for manufacturing a light-emitting diode 100 of Example 1.

In Example 4, materials and/or thickness of the etching stop layer 31, the clad layer 23ab, the light emitting layer 240, the clad layer 23b were different from those in Example 1. The materials and/or thickness of the layers were described below.

The light-emitting diode 102 includes an etching stop layer 31 composed of Si-doped n-type $(Al_{0.5}Ga_{0.5})_{0.5}In_{0.5}P$, a clad layer 23ab composed of Si-doped n-type $Al_{0.45}GaAs$, a light-emitting layer 24 formed by laminating alternately 3 layers of well layers composed of GaAs and 2 layers of barrier layers composed of $Al_{0.25}GaAs$, and a clad layer 23b composed of Mg-doped p-type $Al_{0.45}GaAs$ With respect to the etch stop layer 31, the carrier concentration thereof was set at approximately $1 \times 10^{18}$ cm$^{-3}$ and the layer thickness was set at approximately 1.0 μm. With respect to the well layer and the barrier layer of the light-emitting layer 24, undoped layer thickness was approximately 7 nm.

In the step of forming the current-blocking portion 231, in the same manner as the method of manufacturing a light-emitting diode 100 of Example 1, a recess was provided with a bottom face reaching the etching stop layer 31, and void was formed in an area of the light-emitting layer 240 that overlaps the pad section 12a in a planar view. The inner wall of the recess had a circular shape in a planar view with a diameter of 100 μm.

The etching method for forming the void used both of a dry etching method and a wet etching method. Specifically, a resist layer was selectively formed in an area except the area to become the void in a planar view using a photolithography technique. And then, etching to a depth of 2 to 4 μm was performed by dry etching method using $SiCl_4$ as an etching gas and under the conditions of bias 50 W and 10 min. After the dry etching, etching to the etch stop layer was performed by a wet etching method using 1:1 diluted hydrochloric acid at 40° C.

Then, a translucent insulating material layer 232 was formed on the inner wall of the void at the same time of forming the translucent layer 8 by forming a $SiO_2$ layer by a CVD method over the entire surface of the current diffusion layer 25. The inner wall of the void on which the translucent insulating material layer 232 was formed had a circular shape in a planar view with a diameter of 99 μm Then, an ohmic contact electrode 7 was formed in the same manner as the method of manufacturing a light-emitting diode 100 of Example 1. Then, on the ohmic contact electrode 7 and the translucent layer 8, in the void in which the translucent insulating material layer 232 was formed, a reflection layer 233 was formed using a vapor deposition method at the same time of forming a reflection layer 6 composed of Au. The inner wall of the void surrounded by the reflection layer 233 and the translucent insulating material layer 232 had a circular shape in a planar view with a diameter of 98 μm.

Then, the current-blocking portion 231 was obtained by forming a embedding layer 234 by embedding an insulating material in the void surrounded by the reflection layer 233.

Then, steps before a step of forming the surface electrode 12 were performed in the same manner as the production method of the light-emitting diode 100 of Example 1. In the step of forming the surface electrode 12, a pad section 12a was formed in an area overlapping the current-blocking portion 231 in a planar view.

Then, steps before a dividing step were performed in the same manner as the method of manufacturing the light-emitting diode 102 of Example 1. And then, a light-emitting diode lamp of Example 4 was obtained by mounting divided light-emitting diodes 102 on a mount substrate.

Next, the properties of the lamps including the light-emitting diodes 102 of Example 4 shown in FIG. 12 were evaluated.

When current flows between the ohmic contact electrode 7 and the ohmic electrode 11, the red light having a dominant wavelength of 850 nm was emitted. Forward voltage ($V_F$) was 1.45 V when current of 20 milliamperes (mA) flowed in the forward direction. Light-emitting output was 8.40 mW when the forward current was 20 mA.

Comparative Example

Steps before a dividing step were performed in the same manner as the method of manufacturing the light-emitting diode 100 of Example 1, except that no void 130 was provided. And then, a light-emitting diode lamp of Comparative Example was obtained by mounting divided light-emitting diodes on a mount substrate.

Next, the properties of the lamps of Comparative Example were evaluated.

When current flows between the ohmic contact electrode 7 and the ohmic electrode 11, the red light having a dominant wavelength of 620 nm was emitted. Forward voltage ($V_F$) was 1.95 V when current of 20 milliamperes (mA) flowed in the forward direction. Light-emitting output was 8.00 mW when the forward current was 20 mA.

According to the evaluated results of Examples 1 to 4 and Comparative Example, it was confirmed that the light outputs were improved due to improving light extraction efficiency by providing the current-blocking portion inhibiting a current supplied to the under-pad light-emitting layer.

DESCRIPTION OF REFERENCE NUMERALS

1: metal substrate (substrate)
1a, 1b: metal layer
1ba: upper surface
1bb: bottom face
2: metal protective layer
4: bonding layer
5: barrier layer
6,133,233: reflection layer
7: ohmic contact electrode
8: translucent layer
10: compound semiconductor layer 11: ohmic electrode
12: surface electrode
12a: pad section
12b: linear section (branches)
13,131,231: current-blocking portion
13a: inner wall
13b: outer wall
21: semiconductor substrate (growth substrate)
22a: buffer layer
22b: substrate etching stop layer
22c: contact layer
23aa: surface roughening layer
23ab, 23b: clad layer
24,240: light-emitting layer
24a: under-pad light-emitting layer
25: current diffusion layer
31: etching stop layer
100, 101, 102: light-emitting diode
130: void
130a: bottom
132, 232: translucent insulating material layer

The invention claimed is:

1. A light-emitting diode comprising
a compound semiconductor layer provided on a substrate and comprising a light-emitting layer and an etching stop layer in this order;
an ohmic contact electrode provided between the substrate and the compound semiconductor layer;
an ohmic electrode provided on an opposite side of the compound semiconductor layer with respect to the substrate;
a surface electrode comprising a branch section provided so as to cover a surface of the ohmic electrode and a pad section coupled to the branch section; and
a current-blocking portion provided between an under-pad light-emitting layer arranged in an area of the light-emitting layer that overlaps the pad section in a planar view and a light-emitting layer arranged in an area except an area that overlaps the pad section in a planar view, to prevent a current being supplied to the under-pad light-emitting layer,
wherein the current-blocking portion has an annular shape in a planar view so as to surround the under-pad light-emitting layer, and
an end face of the current-blocking portion in the thickness direction of the light-emitting diode furthest from the substrate is provided to contact with the etch stop layer.

2. The light-emitting diode according to claim 1, wherein said current-blocking portion is a void.

3. The light-emitting diode of claim 1, wherein said current-blocking portion is formed by embedding an insulating material.

4. The light-emitting diode of claim 1, wherein said current-blocking portion comprises a reflection layer and a translucent insulating material layer arranged between the reflection layer and the compound semiconductor layer.

5. The light-emitting diode according to claim 1, wherein the substrate is any one of a Ge substrate, GaP substrate, or GaAs substrate or a metal substrate.

6. The light-emitting diode of claim 1, wherein the pad section has a circular shape in a planar view.

7. The light-emitting diode of claim 1, wherein the light emitting layer is consisted of any one of AlGaAs, InGaAs, or AlGaInP.

8. The light-emitting diode of claim 1, wherein the ohmic contact electrode is formed in an area which does not overlap the pad section in a planar view.

9. A light-emitting diode lamp comprising the light-emitting diode according to claim 1.

10. An illumination device in which multiple light-emitting diodes according to claim 1 are mounted.

11. A method of manufacturing the light-emitting diode according to claim 1, the light-emitting diode comprising the surface electrode having the pad section, which method comprises the steps of in this order:
forming the compound semiconductor layer comprising the etching stop layer and the light-emitting layer on a growth substrate in this order;
forming the current-blocking portion consisting of a recess penetrating the light emitting layer in a periphery of the pad section of the compound semiconductor layer in a planar view by using a dry etching method and a wet etching method in this order;
forming the ohmic contact electrode on the compound semiconductor layer;
bonding the substrate to the compound semiconductor layer on a side of the ohmic contact electrode, and then removing the growth substrate;
forming the ohmic electrode on an opposite side of the compound semiconductor layer with respect to the substrate; and
forming the surface electrode by forming the branch section so as to cover the surface of the ohmic electrode and the pad section coupled to the branch section.

12. The method of manufacturing a light-emitting diode according to claim 11, wherein said current-blocking portion is formed by embedding an insulating material in the recess.

13. The method of manufacturing a light-emitting diode according to claim 12,
wherein the step of forming the ohmic contact electrode comprises a step of forming a translucent layer on the compound semiconductor layer so as to form the ohmic contact electrode penetrating the translucent layer; and
the step of embedding the insulating material is performed by embedding the translucent layer in the recess in the step of forming the translucent layer.

14. The method of manufacturing a light-emitting diode according to claim 11,
wherein the current-blocking portion is formed by depositing a translucent insulating material on an inner wall and a bottom face of the recess, and then embedding a metal material via the translucent insulating material in the recess.

15. The method of manufacturing a light-emitting diode according to claim 14,
wherein the step of forming the ohmic contact electrode comprises a step of forming a translucent layer on the compound semiconductor layer so as to form the ohmic contact electrode penetrating the translucent layer;
the method further comprises a step of forming a reflection layer on the translucent layer before the step of removing the growth substrate; and
the step of depositing the translucent insulating material is performed in the step of forming the translucent layer, and the step of embedding the metal material is performed in the step of forming the reflection layer.

16. A light-emitting diode, comprising
a compound semiconductor layer provided on a substrate and comprising a light-emitting layer and an etching stop layer in this order;

an ohmic contact electrode provided between the substrate and the compound semiconductor layer;
an ohmic electrode provided on an opposite side of the compound semiconductor layer with respect to the substrate; and
a surface electrode comprising a branch section provided so as to cover a surface of the ohmic electrode and a pad section coupled to the branch section,
wherein said light-emitting layer is formed only in the area which does not overlap the pad section in a planar view,
wherein the light-emitting layer is arranged so as to surround a current-blocking portion arranged in an area that overlaps the pad section in a planar view,
said current-blocking portion comprises an embedding layer, a reflection layer and a translucent insulating material layer wherein the two layers of the reflection layer and the translucent insulating material layer are arranged between the embedding layer and the compound semiconductor layer, and
a material of the embedding layer of the current-blocking portion is $SiO_2$, $Si_3N_4$, $TiO_2$ or TiN.

17. A method of manufacturing the light-emitting diode according to claim 16, said light-emitting diode comprising the surface electrode having the pad section, which method comprises steps of in this order:
   forming the compound semiconductor layer comprising the etching stop layer and the light-emitting layer on a growth substrate in this order;
   forming the current-blocking portion consisting of a recess penetrating the light emitting layer immediately below the pad section of the compound semiconductor layer in a planar view by using a dry etching method and a wet etching method in this order;
   forming the ohmic contact electrode on the compound semiconductor layer;
   bonding the substrate to the compound semiconductor layer on a side of the ohmic contact electrode, and then removing the growth substrate;
   forming the ohmic electrode on an opposite side of the compound semiconductor layer with respect to the substrate; and
   forming the surface electrode by forming the branch section so as to cover the surface of the ohmic electrode and the pad section coupled to the branch section.

18. The method of manufacturing a light-emitting diode according to claim 17, wherein the current-blocking portion is formed by depositing a translucent insulating material on an inner wall and a bottom face of the recess, and then embedding a metal material and an insulating material in this order via the translucent insulating material in the recess.

19. The light-emitting diode of claim 16, wherein the embedding layer of the current-blocking layer consists of $SiO_2$, $Si_3N_4$, $TiO_2$ or TiN.

* * * * *